(12) United States Patent
Yoshimura et al.

(10) Patent No.: US 10,148,249 B2
(45) Date of Patent: Dec. 4, 2018

(54) HIGH FREQUENCY CIRCUIT AND COMMUNICATION APPARATUS

(71) Applicant: Murata Manufacturing Co., Ltd., Nagaokakyo-shi, Kyoto-fu (JP)

(72) Inventors: Yoshihiro Yoshimura, Nagaokakyo (JP); Masanori Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/669,209

(22) Filed: Aug. 4, 2017

(65) Prior Publication Data

US 2018/0041190 A1 Feb. 8, 2018

(30) Foreign Application Priority Data

Aug. 5, 2016 (JP) .................................. 2016-154955
Apr. 24, 2017 (JP) .................................. 2017-085473
Jul. 26, 2017 (JP) .................................. 2017-144445

(51) Int. Cl.
| | |
|---|---|
| *H04B 7/00* | (2006.01) |
| *H03H 9/54* | (2006.01) |
| *H03H 7/38* | (2006.01) |
| *H03H 1/00* | (2006.01) |
| *H03H 9/70* | (2006.01) |
| *H03H 9/64* | (2006.01) |
| *H03H 9/72* | (2006.01) |
| *H04B 1/40* | (2015.01) |
| *H04B 1/16* | (2006.01) |
| *H04B 1/04* | (2006.01) |

(52) U.S. Cl.
CPC .......... *H03H 9/542* (2013.01); *H03H 1/0007* (2013.01); *H03H 7/38* (2013.01); *H03H 9/547* (2013.01); *H03H 9/6409* (2013.01); *H03H 9/706* (2013.01); *H03H 9/725* (2013.01); *H03H 2001/0021* (2013.01); *H04B 1/04* (2013.01); *H04B 1/16* (2013.01); *H04B 1/40* (2013.01)

(58) Field of Classification Search
CPC ..... H04W 88/02; H04W 88/06; H04W 88/10; H04W 92/02
USPC ..................... 370/310, 339, 343; 455/82–84, 455/188.1–191.1
See application file for complete search history.

(56) References Cited

U.S. PATENT DOCUMENTS 6,876,840 B2 * 4/2005 Shin ....................... H04B 1/005
                                                     333/132
6,927,648 B2 * 8/2005 Furuya ................. H03H 7/0115
                                                     333/132

(Continued)

FOREIGN PATENT DOCUMENTS

JP         2011-091862 A      5/2011

*Primary Examiner* — Dmitry H Levitan
(74) *Attorney, Agent, or Firm* — Keating & Bennett, LLP

(57) ABSTRACT

A high frequency circuit includes a first demultiplexing circuit including a first high pass filter and a low pass filter and a second demultiplexing circuit including a band elimination filter and a band pass filter, the second demultiplexing circuit being connected in series with the first demultiplexing circuit. At least one of the band elimination filter and the band pass filter includes an elastic wave resonator. An attenuation band of the band elimination filter and a pass band of the band pass filter is located between a pass band of the first high pass filter and a pass band of the low pass filter.

29 Claims, 19 Drawing Sheets

(56) References Cited

U.S. PATENT DOCUMENTS

| | | | | |
|---|---|---|---|---|
| 7,034,638 B2* | 4/2006 | Yamamoto | | H03H 9/6483 |
| | | | | 310/313 R |
| 7,546,091 B2* | 6/2009 | Murakami | | H03H 7/38 |
| | | | | 333/100 |
| 7,583,936 B2* | 9/2009 | Kovacs | | H04B 1/18 |
| | | | | 333/133 |
| 7,843,258 B2* | 11/2010 | Ishiguro | | H03F 3/45183 |
| | | | | 327/552 |
| 8,582,478 B2* | 11/2013 | He | | H04L 27/00 |
| | | | | 370/281 |
| 9,225,382 B2* | 12/2015 | Khlat | | H04B 1/44 |
| 9,270,302 B2* | 2/2016 | Khlat | | H04B 1/0064 |
| 9,729,125 B2* | 8/2017 | Nosaka | | H03H 9/6483 |
| 2007/0159274 A1* | 7/2007 | Onzuka | | H03H 9/14597 |
| | | | | 333/193 |
| 2010/0091752 A1 | 4/2010 | Kemmochi et al. | | |
| 2014/0113580 A1* | 4/2014 | Yamazaki | | H03H 9/6483 |
| | | | | 455/307 |
| 2015/0236748 A1* | 8/2015 | Nobbe | | H04B 17/12 |
| | | | | 455/78 |

\* cited by examiner

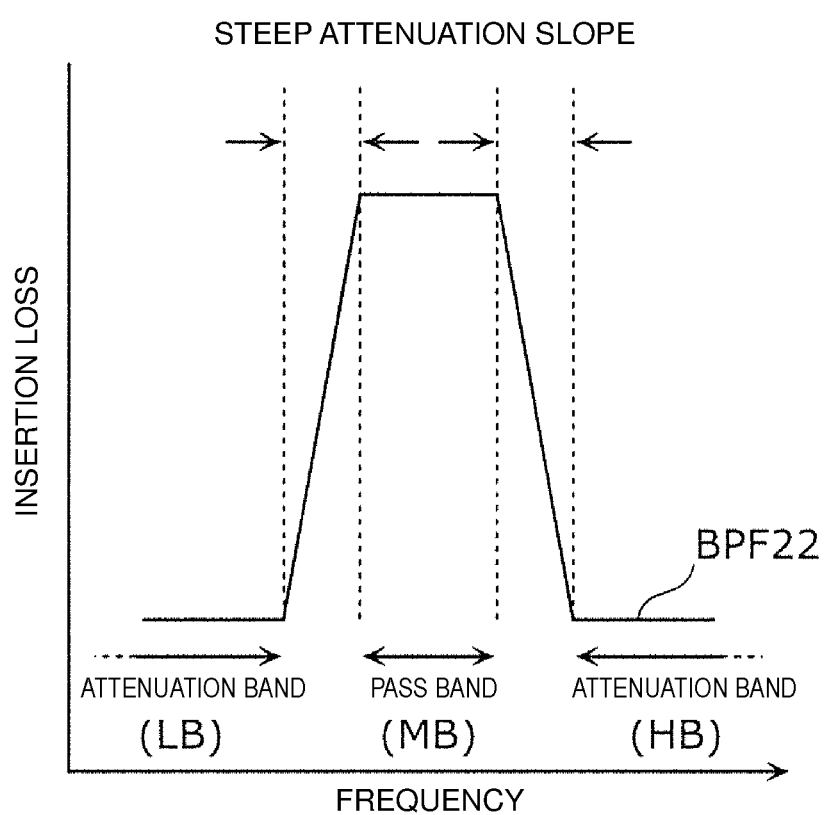

HIGH FREQUENCY CIRCUIT AND COMMUNICATION APPARATUS

CROSS REFERENCE TO RELATED APPLICATIONS

This application claims the benefit of priority to Japanese Patent Application No. 2017-144445 filed on Jul. 26, 2017, Japanese Patent Application No. 2017-085473 filed on Apr. 24, 2017, and Japanese Patent Application No. 2016-154955 filed on Aug. 5, 2016. The entire contents of these applications are hereby incorporated herein by reference.

BACKGROUND OF THE INVENTION

1. Field of the Invention

The present invention relates to a high frequency circuit and a communication apparatus.

2. Description of the Related Art

In recent years, regarding communication apparatuses such as cellular phone terminals, transmission and reception using a plurality of frequency bands and a plurality of wireless methods at the same time by a single terminal, that is, supporting so-called carrier aggregation (CA), has been required. Communication apparatuses adopting such a method employ, for example, a demultiplexing/multiplexing circuit for isolating (demultiplexing)/combining (multiplexing) high frequency signals for individual frequency bands. Specifically, a circuit illustrated in FIG. 19 is used. FIG. 19 is a configuration diagram illustrating an example of a known demultiplexing circuit.

FIG. 19 illustrates a demultiplexing circuit in which a plurality of (for example, two) diplexers each including an LC resonance circuit are connected in series. In the demultiplexing circuit, by a diplexer 401 which includes a high pass filter (hereinafter, may be referred to as an HPF) and a low pass filter (hereinafter, may be referred to as an LPF), a high frequency signal which is input to a terminal Port 41 is demultiplexed into signals of frequency bands corresponding to pass bands of the HPF and the LPF. Furthermore, by a diplexer 402 which includes an HPF and an LPF, a signal which is output from the LPF of the diplexer 401 is demultiplexed into signals of frequency bands corresponding to pass bands of the HPF and the LPF. Accordingly, signals corresponding to the pass bands of the LPF of the diplexer 401 and the LPF of the diplexer 402, which are connected in series, the pass bands of the LPF of the diplexer 401 and the HPF of the diplexer 402, which are connected in series, and the pass band of the HPF of the diplexer 401 are output from the terminals Port 42 to 44, respectively.

A technique related to such a demultiplexing circuit is disclosed in Japanese Unexamined Patent Application Publication No. 2011-91862.

However, with the demultiplexing circuit illustrated in FIG. 19, the steepness of an attenuation slope located within a transition band in bandpass characteristics of the diplexers 401 and 402 is low (attenuation gradient is small). Therefore, it is difficult to demultiplex signals having bandpass frequency bands that are close to each other. To address the above problem, increasing the steepness of an attenuation slope located within a transition band in bandpass characteristics of a diplexer is considered. However, in general, it is highly difficult to achieve design to increase the steepness of an attenuation slope located within a transition band in bandpass characteristics of a diplexer.

SUMMARY OF THE INVENTION

Accordingly, preferred embodiments of the present invention provide high frequency circuits and communication apparatuses having a simple configuration, capable of performing transmission and reception of a plurality of signals having different frequency bands at the same time, and having an increased steepness of an attenuation slope located within a transition band in bandpass characteristics.

According to a preferred embodiment of the present invention, a high frequency circuit includes a first demultiplexing circuit which includes a first high pass filter and a low pass filter; and a second demultiplexing circuit which includes a band elimination filter and a band pass filter, the second demultiplexing circuit being connected in series with the first demultiplexing circuit. At least one of the band elimination filter and the band pass filter includes an elastic wave resonator. A pass band of the first high pass filter is located on a high frequency side relative to a pass band of the low pass filter. An attenuation band of the band elimination filter and a pass band of the band pass filter are located between the pass band of the first high pass filter and the pass band of the low pass filter.

The first HPF has a wide pass band on a higher frequency side, the LPF has a wide pass band on a lower frequency band, and each band of one or more band pass filters (hereinafter, may also be referred to as BPFs) are located between the pass band of the first HPF and the pass band of the LPF. With a configuration in which the first demultiplexing circuit which includes the first HPF and the LPF and the second demultiplexing circuit which includes a BPF are connected in series, transmission and reception of a plurality of signals having different frequency bands are able to be performed at the same time. In other words, CA for signals over a range from signals of a lower frequency bands to signals of a higher frequency band is achieved. A band represents, for example, a long term evolution (LTE) band. Furthermore, the band elimination filter (hereinafter, may also be referred to as a BEF) and the BPF may include an elastic wave resonator, and therefore, the steepness of an attenuation slope located within a transition band in bandpass characteristics of the BEF and the BPF is high. Accordingly, for example, a signal containing a frequency component of the pass band of the BPF and a signal containing a frequency component of the pass band of the first HPF or the pass band of the LPF are less likely to affect each other. Furthermore, in the case where the BPF includes two or more BPFs, signals containing frequency components of the pass bands of the two or more BPFs are less likely to affect each other. As described above, with a simple configuration in which the first demultiplexing circuit which includes the first HPF and the LPF and the second demultiplexing circuit which includes the BEF and the BPF are connected in series, transmission and reception of a plurality of signals having different frequency bands are able to be performed at the same time, and the steepness of an attenuation slope located within a transition band in bandpass characteristics is able to be increased.

Furthermore, the first high pass filter and the low pass filter may include a first common terminal, the first common terminal and a terminal of the band elimination filter may be connected in series, the band elimination filter and the band pass filter may include a second common terminal, and an attenuation slope located within a transition band in bandpass characteristics of the band elimination filter may cause at least one of an attenuation slope located within a transition band in bandpass characteristics of the first high pass filter and an attenuation slope located within a transition band in bandpass characteristics of the low pass filter to be attenuated.

Accordingly, the attenuation slope of the first HPF with a low steepness in the transition band of the BEF on a higher frequency side, is attenuated by the attenuation slope of the BEF with a high steepness, and the steepness of the attenuation slope of the first HPF is thus increased. In a similar manner, for example, the attenuation slope of the LPF with a low steepness in the transition band of the BEF on a lower frequency side, is attenuated by the attenuation slope of the BEF with a high steepness, and the steepness of the attenuation slope of the LPF is thus increased. Accordingly, a signal containing a frequency component of the pass band of the BPF and a signal containing a frequency component of the pass band of the first HPF or the LPF are less likely to affect each other. That is, demultiplexing/multiplexing of signals having bandpass frequency bands which are close to each other is performed easily.

Furthermore, the first demultiplexing circuit may further include a second high pass filter, the band elimination filter and the band pass filter may include a common terminal, the common terminal and a terminal of the second high pass filter is able to be connected, a pass band of the second high pass filter is able to be located between the pass band of the first high pass filter and the pass band of the low pass filter, and the pass band of the second high pass filter, the pass band of the band pass filter, and the attenuation band of the band elimination filter may overlap.

As described above, the attenuation band of the BEF and the pass band of the BPF overlap, and therefore, a signal containing a frequency component of the pass band of the BPF and a signal containing a frequency component of a range other than the attenuation band of the BEF in the pass band of the second HPF are less likely to affect each other. Furthermore, a portion of the pass band of the second HPF is attenuated by the attenuation slope of the BEF with a high steepness, and therefore, the steepness of the attenuation slopes of the second HPF and the BEF which are connected in series is increased.

Furthermore, the first high pass filter and the low pass filter may include LC resonance circuits.

Accordingly, a first HPF having a wide pass band on a higher frequency side and an LPF having a wide pass band on a lower frequency side is achieved easily, and CA is achieved for signals over a range from signals having a lower frequency band to signals having a higher frequency band. In the case where an LC resonance circuit is implemented by a single component such as a chip inductor or a chip capacitor, flexible matching adjustment for the first HPF and the LPF is achieved. Furthermore, in the case where an LC resonance circuit is implemented by, for example, an integrated passive device (IPD), miniaturization of the first HPF and the LPF is achieved.

Furthermore, an inductor may be connected in parallel with the band pass filter.

In general, in the case where the pass band of a BPF is increased, the attenuation in a range other than the pass band is reduced. Thus, by connecting an inductor having an attenuation pole in a range other than the pass band of the BPF, which has a wide pass band, in parallel to the BPF, the attenuation in the range other than the pass band is able to be increased.

Furthermore, the band pass filter may include a first band pass filter and a second band pass filter having different pass bands.

Accordingly, transmission and reception of signals of more frequency bands are able to be performed.

Furthermore, the high frequency circuit may further include a matching circuit which is connected to the first band pass filter and the second band pass filter. Among the pass band of the first band pass filter and the pass band of the second band pass filter, the pass band of the first band pass filter may be located closer to a desired pass band of the band elimination filter than the pass band of the second band pass filter is. Wiring which connects the matching circuit with the first band pass filter may be shorter than wiring which connects the matching circuit with the second band pass filter.

When the pass band of the first BPF and the desired pass band of the BEF are close to each other, the first BPF is likely to affect the BEF. For example, in the case where wiring which connects the matching circuit with the first BPF is long, the amount of variations in the impedance by the wiring and the amount of adjustment in the impedance matching of the first BPF are increased. Accordingly, the BEF whose desired pass band is located close to the pass band of the first BPF is affected by the impedance matching for the wiring. In contrast, the pass band of the second BPF is far away from the desired pass band of the BEF, and therefore is less likely to affect the BEF. Thus, for example, even in the case where wiring which connects the matching circuit with the second BPF is long, the BEF whose desired pass band is not located close to the pass band of the second BPF is less likely to be affected by the impedance matching for the wiring. In the case where the wiring which connects the matching circuit with the first BPF is shorter than the wiring which connects the matching circuit with the second BPF, the amount of adjustment in the impedance matching of the first BPF by the wiring which connects the matching circuit with the first BPF is reduced, and the influence of the impedance matching of the first BPF on the BEF is reduced.

Furthermore, the high frequency circuit may further include a low noise amplifier circuit, and the first demultiplexing circuit and the low noise amplifier circuit are able to be provided by a same chip.

Accordingly, by providing the first demultiplexing circuit and the low noise amplifier (hereinafter, may also be referred to as an LNA) circuit in the same chip (implemented by one chip), miniaturization of the high frequency circuit is achieved.

Furthermore, the high frequency circuit may further include a switch circuit, and the first demultiplexing circuit and the switch circuit are able to be provided by a same chip.

Accordingly, by providing the first demultiplexing circuit and the switch circuit in the same chip, miniaturization of the high frequency circuit is achieved.

Furthermore, the high frequency circuit may further include a multilayer substrate which includes a plurality of laminated layers. Each of the first high pass filter and the low pass filter may include an LC resonance circuit. Each of the band elimination filter and the band pass filter may be a ladder-type surface acoustic wave filter. The multilayer substrate may include a reference ground layer that is a lowermost layer of the multilayer substrate, a first layer, and a second layer. A reference ground pattern having a reference potential of the multilayer substrate may be provided at the reference ground layer. A ground pattern of the first demultiplexing circuit may be provided at the first layer, the ground pattern of the first demultiplexing circuit being electrically connected to the reference ground pattern. A ground pattern of the second demultiplexing circuit may be provided at the second layer, the ground pattern of the second demultiplexing circuit being electrically connected to the reference ground pattern. The first layer may be located closer to the reference ground layer than the second layer is.

The reference ground layer connects the ground of the high frequency circuit to the ground of a substrate of a set maker or the like in the case where the high frequency circuit is connected to the substrate of the set maker or the like. In the multilayer substrate, a ground pattern which is located at a layer farther away from the reference ground layer includes a larger parasitic inductor component. Accordingly, by providing a ground pattern of a ladder-type surface acoustic wave filter far away from the reference ground pattern, the parasitic inductor component increases, and attenuation characteristics in a range other than the pass band of the ladder-type surface acoustic wave filter are improved. Therefore, in the case where the ground patterns of the BEF and the BPF, which are ladder-type surface acoustic wave filters, of the second demultiplexing circuit, are provided at a second layer which is located farther away from the reference ground layer than the first layer is, the ground patterns of the first HPF and the LPF, which are LC resonance circuits, of the first demultiplexing circuit being provided at the first layer, attenuation characteristics in a range other than the pass bands of the BEF and the BPF are improved.

Furthermore, the high frequency circuit may further include a multilayer substrate including a plurality of laminated layers; and a third demultiplexing circuit which is an elastic wave filter. A ground pattern of the second demultiplexing circuit and a ground pattern of the third demultiplexing circuit may be arranged isolated from each other at one of the plurality of layers.

Accordingly, the second demultiplexing circuit and the third demultiplexing circuit are prevented from affecting each other.

Furthermore, according to a preferred embodiment of the present invention, a high frequency circuit includes a first demultiplexing circuit which includes a second high pass filter and a low pass filter; and a second demultiplexing circuit which includes a band elimination filter and a band pass filter, the second demultiplexing circuit being connected in series with the first demultiplexing circuit. At least one of the band elimination filter and the band pass filter includes an elastic wave resonator. A pass band of the second high pass filter is located on a high frequency side relative to a pass band of the low pass filter. An attenuation band of the band elimination filter and a pass band of the band pass filter are located on a high frequency side relative to the pass band of the low pass filter and overlap with the pass band of the second high pass filter.

The LPF has a wide pass band on a lower frequency side, and the pass bands of one or more BPFs are located on a high frequency side relative to the pass band of the LPF. By connecting the first demultiplexing circuit which includes the LPF and the second demultiplexing circuit which includes the BPF in series, transmission and reception of a plurality of signals having different frequency bands are able to be performed at the same time. Furthermore, the BEF and the BPF may include an elastic wave resonator, and therefore, the steepness of an attenuation slope located within a transition band in bandpass characteristics is high. Accordingly, a signal containing a frequency component of the pass band of the BPF and a signal containing a frequency component of the pass band of the LPF are less likely to affect each other. Furthermore, a portion of the pass band of the second HPF is attenuated by the attenuation slope of the BEF with a high steepness, and therefore, the steepness of the attenuation slope of the second HPF and the BEF which are connected in series is increased. Accordingly, the attenuation band of the BEF and the pass band of the BPF overlap, and therefore, a signal containing a frequency component of the pass band of the BPF and a signal containing a frequency component in a range other than the attenuation band of the BEF in the pass band of the second HPF are less likely to affect each other. Furthermore, in the case where the BPF includes two or more BPFs, signals containing frequency components of pass bands of the two or more BPFs are less likely to affect each other. As described above, with a simple configuration in which the first demultiplexing circuit which includes the second HPF and the LPF and the second demultiplexing circuit which includes the BEF and the BPF are connected in series, transmission and reception of a plurality of signals having different frequency bands are able to be performed at the same time, and the steepness of an attenuation slope located within a transition band in bandpass characteristics is increased.

According to a preferred embodiment of the present invention, in the high frequency circuit, the band elimination filter may be a hybrid filter which includes at least one elastic wave resonator and at least one inductor.

With this configuration, the steepness of an attenuation slope located within a transition band in bandpass characteristics is increased.

According to a preferred embodiment of the present invention, the high frequency circuit may be a multiplexer which performs transmission, reception, or both transmission and reception of a plurality of signals at the same time.

With this configuration, carrier aggregation which implements transmission, reception, or both transmission and reception of a plurality of signals having pass bands of different frequency bands at the same time is achieved.

According to a preferred embodiment of the present invention, in the high frequency circuit, the attenuation of the second high pass filter in the pass band of the low pass filter may be about 15 dB or more, compared to a case where the low pass filter is not provided, the second high pass filter may include an inductor and a capacitor, and the low pass filter may include an inductor and a capacitor.

With this configuration, distortion is effectively reduced or prevented.

According to a preferred embodiment of the present invention, in the high frequency circuit, a portion of the pass band of the band pass filter may overlap with a portion of the attenuation band of the band elimination filter.

With this configuration, insertion loss of the band pass filter is improved.

According to a preferred embodiment of the present invention, in the high frequency circuit, a portion of a desired pass band of the band elimination filter may be lower than the pass band of the band pass filter.

With this configuration, for example, the high frequency circuit may be appropriate for carrier aggregation of the MB and the HB in the LTE.

According to a preferred embodiment of the present invention, in the high frequency circuit, the second demultiplexing circuit may further include a high pass filter.

With this configuration, transmission and reception of band signals of different frequency bands at the same time are achieved, and the steepness of an attenuation slope located within a transition band in bandpass characteristics is increased.

According to a preferred embodiment of the present invention, in the high frequency circuit, the band elimination filter may include a low pass filter circuit and a high pass filter circuit which is connected in series with the low pass filter circuit.

With this configuration, band pass filter characteristics are achieved, and attenuation in a region other than the pass band is ensured.

According to a preferred embodiment of the present invention, in the high frequency circuit, an inductor may be connected in parallel with the band pass filter.

With this configuration, the attenuation in a region other than the pass band is increased by the inductor and a parasitic capacitance component generated when the inductor is connected.

According to a preferred embodiment of the present invention, the high frequency circuit may further include a matching circuit which is connected between the second high pass filter and the second demultiplexing circuit.

With this configuration, impedance matching is achieved, and bandpass characteristics may thus be improved.

According to a preferred embodiment of the present invention, in the high frequency circuit, the matching circuit may include at least one of an inductor and a capacitor.

With this configuration, further effective improvement in the bandpass characteristics is achieved.

According to a preferred embodiment of the present invention, in the high frequency circuit, among the pass band of the first band pass filter and the pass band of the second band pass filter, the pass band of the first band pass filter may be located closer to a desired pass band of the band elimination filter than the pass band of the second band pass filter is, and wiring which connects the matching circuit with the first band pass filter may be shorter than wiring which connects the matching circuit with the second band pass filter.

The pass band of the first BPF and the desired pass band of the BEF are located close to each other, and therefore, the first BPF is likely to affect the BEF. For example, in the case where the wiring which connects the matching circuit with the first BPF is long, in response to the amount of variations in the impedance by the wiring, the amount of adjustment in the impedance matching of the first BPF is increased. Accordingly, the BEF whose desired pass band is located close to the pass band of the first BPF is affected by the impedance matching for the wiring. In contrast, the pass band of the second BPF is far away from the desired pass band of the BEF, and therefore, the second BPF is less likely to affect the BEF. Thus, for example, even in the case where wiring which connects the matching circuit with the second BPF is long, the BEF whose desired pass band is not located close to the pass band of the second BPF is less likely to be affected by the impedance matching for the wiring. In the case where the wiring which connects the matching circuit with the first BPF is shorter than the wiring which connects the matching circuit with the second BPF, the amount of adjustment in the impedance matching of the first BPF by the wiring which connects the matching circuit with the first BPF is reduced, and the influence of the impedance matching of the first BPF on the BEF is reduced.

According to a preferred embodiment of the present invention, the high frequency circuit may be a triplexer.

With this configuration, carrier aggregation which implements transmission, reception, or both transmission and reception of three signals having pass bands of different frequency bands at the same time is achieved.

According to a preferred embodiment of the present invention, in the high frequency circuit, the second multiplexing circuit may further include a band pass filter, and the high frequency circuit may be a quadplexer.

With this configuration, carrier aggregation which implements transmission, reception, or both transmission and reception of four signals having pass bands of different frequency bands at the same time is achieved.

According to a preferred embodiment of the present invention, the high frequency circuit may further include a third high pass filter; and a third low pass filter. The first demultiplexing circuit may further include a first high pass filter and a first low pass filter. The second high pass filter and the low pass filter may be connected to the first low pass filter. The third high pass filter and the third low pass filter may be connected to the first high pass filter. The high frequency circuit may be a pentaplexer.

With this configuration, carrier aggregation which implements transmission, reception, or both transmission and reception of five signals having pass bands of different frequency bands at the same time is achieved.

According to a preferred embodiment of the present invention, the second demultiplexing circuit may further include a band pass filter or a high pass filter, and the high frequency circuit may be a hexaplexer.

With this configuration, carrier aggregation which implements transmission, reception, or both transmission and reception of six signals having pass bands of different frequency bands at the same time is achieved.

According to a preferred embodiment of the present invention, a high frequency circuit includes a first demultiplexing circuit which includes a second high pass filter; and a second demultiplexing circuit which includes a band elimination filter and a band pass filter, the second demultiplexing circuit being connected in series with the first demultiplexing circuit. At least one of the band elimination filter and the band pass filter includes an elastic wave resonator. An attenuation band of the band elimination filter and a pass band of the band pass filter overlap with a pass band of the second high pass filter. The band elimination filter is a hybrid filter which includes at least one elastic wave resonator and at least one inductor. The high frequency circuit is a multiplexer which performs transmission, reception, or both transmission and reception of a plurality of signals at the same time.

With this configuration, carrier aggregation which implements transmission, reception, or both transmission and reception of two signals having pass bands of different frequency bands at the same time is achieved, and the high frequency circuit may be applied to a 4×4 multiple-input and multiple-output (so-called "4×4 MIMO": technology for transmission and reception of data using four antennas at the same time for each of transmission and reception) which uses a high frequency signal of the HB and a high frequency signal of the MB.

According to a preferred embodiment of the present invention, the high frequency circuit may further include a third high pass filter; and a third low pass filter. The first demultiplexing circuit may further include a first high pass filter and a first low pass filter. The second high pass filter may be connected to the first low pass filter. The third high pass filter and the third low pass filter may be connected to the first high pass filter.

With this configuration, carrier aggregation which implements transmission, reception, or both transmission and reception of four signals having pass bands of different frequency bands at the same time is achieved, and the high frequency circuit may be applied to a 4×4 multiple-input and multiple-output (so-called "4×4 MIMO": technology for transmission and reception of data using four antennas at the same time for each of transmission and reception) which uses a high frequency signal of the LTE-U, a high frequency signal of the UHB, a high frequency signal of the HB, and a high frequency signal of the MB.

Furthermore, according to a preferred embodiment of the present invention, a communication apparatus includes an RF signal processing circuit which processes a high frequency signal transmitted and received through an antenna element; and the high frequency circuit which transmits the high frequency signal between the antenna element and the RF signal processing circuit.

Accordingly, a communication apparatus having a simple configuration, capable of performing transmission and reception of a plurality of signals having different frequency bands at the same time, and having an increased steepness of an attenuation slope located within a transition band in bandpass characteristics is able to be provided.

With a high frequency circuit and a communication apparatus according to a preferred embodiment of the present invention, transmission and reception of a plurality of signals having different frequency bands is able to be performed at the same time, and the steepness of an attenuation slope located within a transition band in bandpass characteristics is increased.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 3C is a graph illustrating an example of bandpass characteristics in a third path of the high frequency circuit according to the first preferred embodiment of the present invention.

DETAILED DESCRIPTION OF THE PREFERRED EMBODIMENTS

Figure 1:
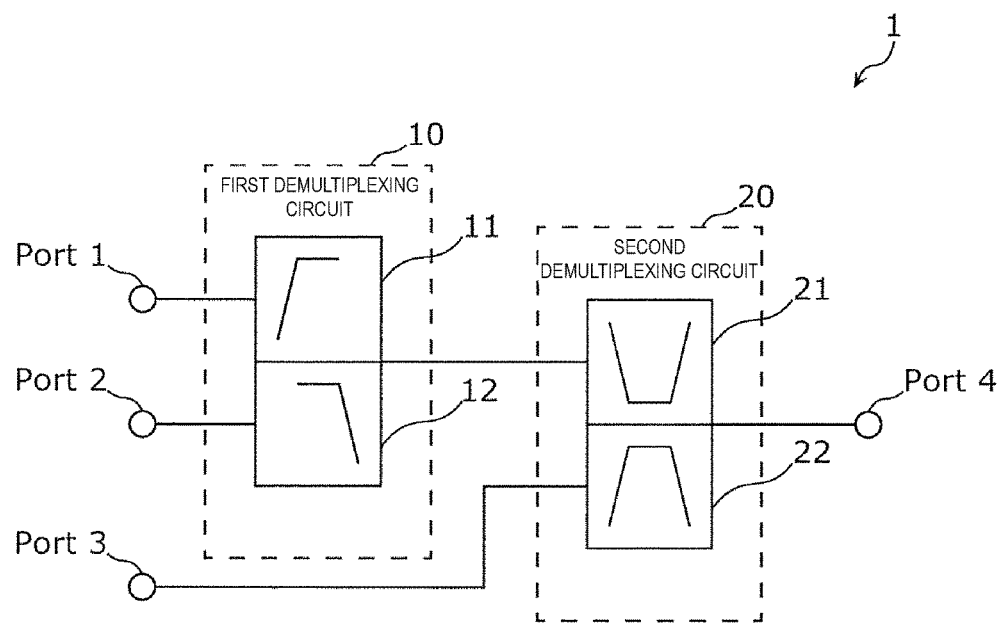
FIG. 1 is a configuration diagram illustrating an example of a high frequency circuit according to a first preferred embodiment of the present invention.

Hereinafter, preferred embodiments of the present invention will be described in detail with reference to drawings. Each of the preferred embodiments described below illustrates a comprehensive or specific example. The numerical values, components, arrangement and connection configuration of the components, and the like illustrated in the preferred embodiments described below are merely an example, and are not intended to limit the present invention. Any component in the preferred embodiments described below which is not described in an independent claim will be described as an arbitrary component. Furthermore, sizes of components illustrated in the drawings or the ratio of sizes of the components is not necessarily exact.

First Preferred Embodiment

First, a configuration of a high frequency circuit 1 according to a first preferred embodiment will be described with reference to FIGS. 1, 2A, and 2B.

FIG. 1 is a configuration diagram illustrating an example of the high frequency circuit 1 according to the first preferred embodiment.

The high frequency circuit 1 includes a first demultiplexing circuit 10 and a second demultiplexing circuit 20 which is connected in series with the first demultiplexing circuit 10. A demultiplexing circuit is a circuit that has a function of combining a plurality of signal paths through which high frequency signals of different frequency bands are transmitted into one signal path or a function of dividing one signal path into a plurality of signal paths through which high frequency signals of different frequency bands are transmitted. Furthermore, the high frequency circuit 1 includes terminals Port 1 to Port 4. High frequency signals of different frequency bands are transmitted through signal paths which connect the terminals Port 1 to Port 3 with the terminal Port 4. The high frequency circuit 1 has a function of multiplexing high frequency signals input to the terminals Port 1 to Port 3 and outputting the resultant signal from the terminal Port 4. The high frequency circuit 1 also has a function of demultiplexing a high frequency signal input to the terminal Port 4 and outputting the resultant signals from the terminals Port 1 to Port 3. For example, a high frequency signal of a High Band (HB) is transmitted through a signal path which connects the terminal Port 1 with the terminal Port 4, a high frequency signal of a Low Band (LB) is transmitted through a signal path which connects the terminal Port 2 with the terminal Port 4, and a high frequency signal of a Middle Band (MB) is transmitted through a signal path which connects the terminal Port 3 with the terminal Port 4. For example, in this example, the HB represents a frequency band from about 2300 MHz to about 2700 MHz, the LB represents a frequency band of about 2100 MHz, and the MB represents a frequency band from about 2100 MHz to about 2200 MHz. The above frequency bands are merely examples, and other frequency bands may be used in preferred embodiments of the present invention. The high frequency circuit 1 is, for example, a circuit which allows signal paths connected to the terminals Port 1 to Port 3, respectively, to be combined together at the terminal Port 4.

The first demultiplexing circuit 10 includes a first HPF 11 and an LPF 12. The pass band of the first HPF 11 is located on a high frequency side relative to the pass band of the LPF 12. The first HPF 11 and the LPF 12 are, for example, LC resonance circuits. Accordingly, the first HPF 11 having a wide pass band on a higher frequency side and the LPF 12 having a wide pass band on a lower frequency side is able to be implemented easily, and CA is able to be achieved for signals over a wide range from signals of a lower frequency band to signals of a higher frequency band. However, the bandpass characteristics of the first HPF 11 and the LPF 12 exhibit a low steepness of an attenuation slope.

The first HPF 11 and the LPF 12 are implemented, as LC resonance circuits, for example, by discrete components such as a chip inductor, a chip capacitor, and the like. Furthermore, the first HPF 11 and the LPF 12 are able to be implemented, as LC resonance circuits, for example, by IPDs. Accordingly, miniaturization of the first HPF 11 and the LPF 12 is able to be achieved. The first HPF 11 and the LPF 12 have a general circuit configuration in which an inductor and a capacitor are simply connected in series or in parallel. Therefore, illustration of the circuit configuration of the first HPF 11 and the LPF 12 will be omitted.

The second demultiplexing circuit 20 includes a BEF 21 and a BPF 22. At least one of the BEF 21 and the BPF 22 includes an elastic wave resonator. The elastic wave resonator may be a surface acoustic wave (SAW) resonator or a bulk acoustic wave (BAW) resonator. In this preferred embodiment, for example, each of the BEF 21 and the BPF 22 includes a SAW resonator. The detailed circuit configuration of the BEF 21 and the BPF 22 will be described later with reference to FIGS. 2A and 2B.

A filter including a SAW resonator includes a substrate and an interdigital transducer (IDT) electrode. The substrate has piezoelectricity at least on a surface. For example, the substrate may be a multilayer body including a piezoelectric thin film provided at the surface, a film with an acoustic velocity different from that of the piezoelectric thin film, a supporting substrate, and the like. Furthermore, the substrate may have piezoelectricity over the entire substrate. In this case, the substrate is a piezoelectric substrate including a single piezoelectric layer.

The terminal Port 1 is connected to an input terminal of the first HPF 11 having a pass band of the HB. The terminal Port 2 is connected to an input terminal of the LPF 12 having a pass band of the LB. The terminal Port 3 is connected to an input terminal of the BPF 22 having a pass band of the MB. Furthermore, the first HPF 11 and the LPF 12 have a first common terminal (output terminal), and the first common terminal and an input terminal of the BEF 21 are connected in series. That is, in this preferred embodiment, series connection between the first demultiplexing circuit 10 and the second demultiplexing circuit 20 represents series connection between the first common terminal and the input terminal of the BEF 21. For example, the BEF 21 performs further filtering of a signal filtered through the first HPF 11 or a signal filtered through the LPF 12.

Furthermore, the BEF 21 and the BPF 22 include a second common terminal (output terminal), and a signal filtered through the BEF 21 or the BPF 22 is output from the terminal Port 4. That is, a signal filtered through the first HPF 11 and the BEF 21 that are connected in series, a signal filtered through the LPF 12 and the BEF 21 that are connected in series, and a signal filtered through the BPF 22 is output from the terminal Port 4. As described above, the high frequency circuit 1 combines a plurality of signal paths through which high frequency signals of different frequency bands are transmitted into one signal path. In this preferred embodiment, a path passing through the first HPF 11 and the BEF 21 that are connected in series will be referred to as a first path, a path passing through the LPF 12 and the BEF 21 that are connected in series will be referred to as a second path, and a path passing through the BPF 22 will be referred to as a third path.

The high frequency circuit 1 may be implemented as a high frequency module or a semiconductor device in combination with other components. Furthermore, the high frequency circuit 1 may be implemented as a single element, without being combined with other components. For example, in the case where the high frequency circuit 1 is implemented as a single element, the first demultiplexing circuit 10 and the second demultiplexing circuit 20 may be constructed in an integrated manner or a separated manner.

Next, the detailed circuit configuration of the BEF 21 and the BPF 22 will be described with reference to FIGS. 2A and 2B.

Figure 2A:
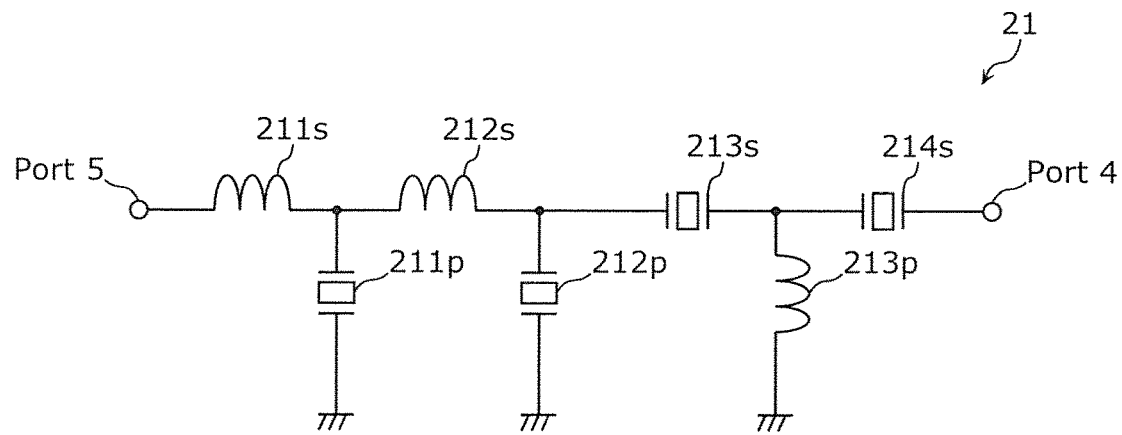
FIG. 2A is a circuit diagram illustrating an example of a BEF according to the first preferred embodiment of the present invention.

FIG. 2A is a circuit diagram illustrating an example of the BEF 21 according to the first preferred embodiment.

Figure 2B:
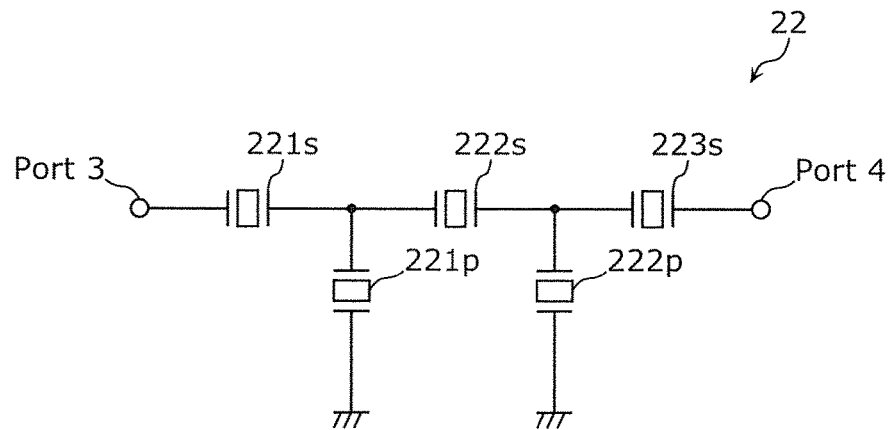
FIG. 2B is a circuit diagram illustrating an example of the BPF according to the first preferred embodiment of the present invention.

FIG. 2B is a circuit diagram illustrating an example of the BPF 22 according to the first preferred embodiment.

In a high frequency circuit according to this application, the BEF 21 includes at least one elastic wave resonator and at least one inductor. Elastic wave resonators exhibit a behavior similar to capacitors in a frequency region where elastic waves are not excited. Therefore, elastic wave resonators exhibit a behavior similar to LC filters in a frequency region where elastic waves are not excited, and exhibit a behavior as elastic wave filters in a region where elastic waves are excited. Accordingly, filters including at least one elastic wave resonator and at least one inductor may be referred to as hybrid filters. Specifically, as illustrated in FIG. 2A, the BEF 21 includes inductors 211s, 212s, and 213p and SAW resonators 211p, 212p, 213s, and 214s. The inductors 211s and 212s and the SAW resonators 213s and 214s are connected in series in a path (series arm) which connects a terminal Port 5 with the terminal Port 4. The terminal Port 4 corresponds to the terminal Port 4 illustrated in FIG. 1. The terminal Port 5 is not illustrated in FIG. 1. The terminal Port 5 is a terminal of the BEF 21 that is connected to the first demultiplexing circuit 10. Furthermore, the SAW resonators 211p and 212p and the inductor 213p are connected in paths (parallel arms) which connect a connection point of the inductors 211s and 212s, a connection point of the inductor 212s and the SAW resonator 213s, and a connection point of the SAW resonators 213s and 214s, respectively, with a reference terminal (ground). An attenuation band of the BEF 21 is based on a low pass filter type circuit (an LPF type circuit) including the inductors 211s and 212s and the SAW resonators 211p and 212p and whose pass band is partially attenuated by an attenuation pole corresponding to the SAW resonators 211p and 212p and a high pass filter type circuit (an HPF type circuit) including the SAW resonators 213s and 214s and the inductor 213p and whose pass band is partially attenuated by an attenuation pole corresponding to the SAW resonators 213s and 214s. By combining an LPF-type circuit and an HPF-type circuit, characteristics of a band pass filter through which a high frequency signal passes in a band different from an attenuation band is obtained, and attenuation in regions other than the pass band is ensured.

The BEF 21, which is a ladder-type SAW filter, preferably has the above connection configuration. The BEF 21 includes a SAW resonator, and therefore, the steepness of an attenuation slope located within a transition band in bandpass characteristics is high.

As illustrated in FIG. 2B, the BPF 22 includes SAW resonators 221s, 222s, 223s, 221p, and 222p. The SAW resonators 221s, 222s, and 223s are connected in series in a path (series arm) which connects the terminal Port 3 with the terminal Port 4. The terminal Port 3 corresponds to the terminal Port 3 illustrated in FIG. 1. The SAW resonators 221p and 222p are connected in paths (parallel arms) which connect a connection point of the SAW resonators 221s and 222s and a connection point of the SAW resonator 222s and 223s, respectively, with a reference terminal (ground). The BPF 22, which is a ladder-type SAW filter, is configured with the above connection configuration. The BPF 22 includes a SAW resonator, and therefore, the steepness of an attenuation slope located within a transition band in bandpass characteristics is high.

Next, bandpass characteristics of the high frequency circuit 1 will be described with reference to FIGS. 3A, 3B, 3C, and 4.

Figure 3A:
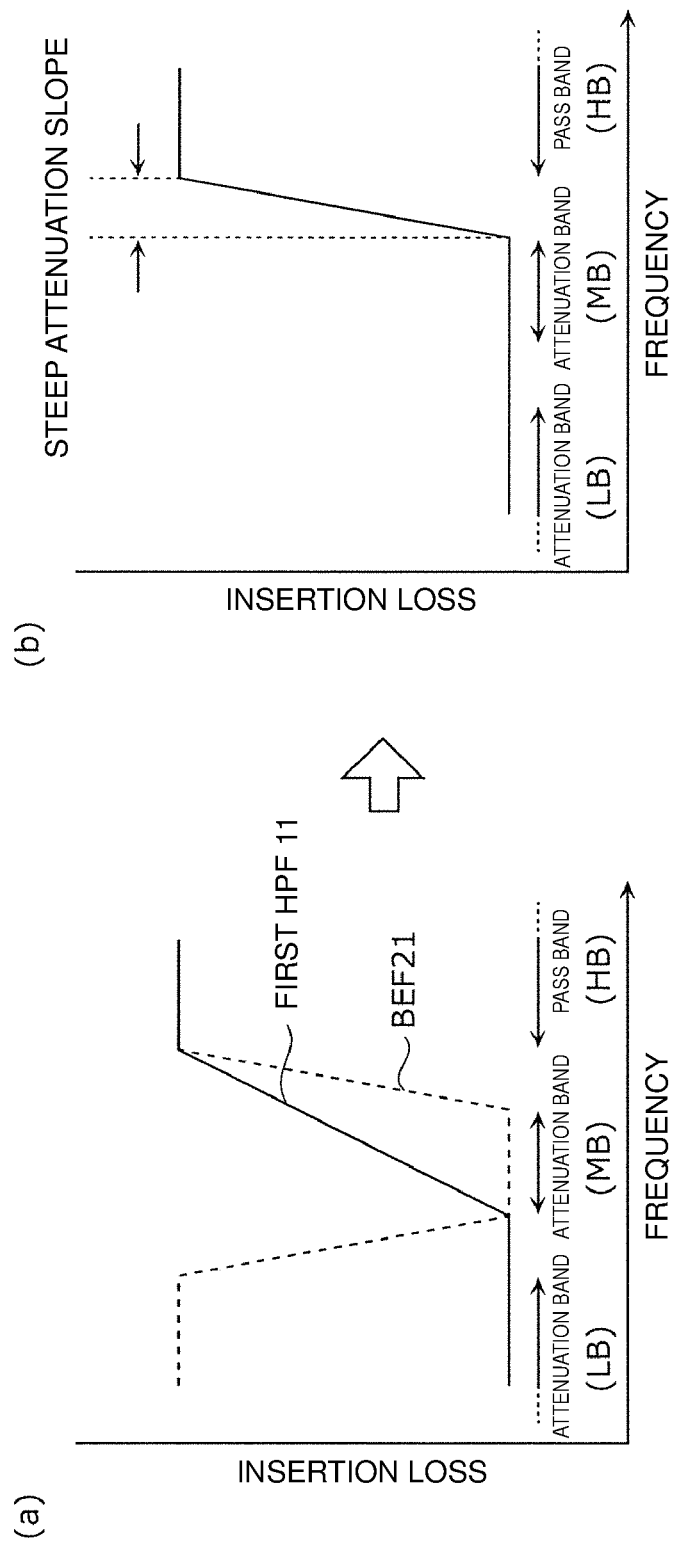
FIG. 3A includes graphs illustrating examples of bandpass characteristics in a first path of the high frequency circuit according to the first preferred embodiment of the present invention.

FIG. 3A includes graphs illustrating examples of bandpass characteristics in the first path of the high frequency circuit 1 according to the first preferred embodiment. Part (a) of FIG. 3A is a graph illustrating the bandpass characteristics of the first HPF 11 and the bandpass characteristics of the BEF 21, and Part (b) of FIG. 3A is a graph illustrating the bandpass characteristics in the path (first path) which passes through the first HPF 11 and the BEF 21, which are connected in series. For example, when attention is paid to the first path, insertion loss, which is the ratio of the intensity of a signal output from the terminal Port 4 to the intensity of a signal input to the terminal Port 1, is schematically illustrated in Part (b) of FIG. 3A.

In Part (a) of FIG. 3A, a solid line represents the bandpass characteristics of the first HPF 11, and a broken line represents the bandpass characteristics of the BEF 21. The attenuation band of the BEF 21 is located on a low frequency side relative to the pass band of the first HPF 11. Specifically, the attenuation slope located within the transition band in the bandpass characteristics of the BEF 21 (a portion where the bandpass characteristics are attenuated from a pass band of the BEF 21 on a higher frequency side toward the attenuation band of the BEF 21) causes the attenuation slope located within the transition band in the bandpass characteristics of the first HPF 11 (a portion where the bandpass characteristics are attenuated from the bandpass characteristics of the first HPF 11 toward the attenuation band of the first HPF 11) to be attenuated. As a result, as illustrated in Part (b) of FIG. 3A, the attenuation slope located within the transition band in the bandpass characteristics in the first path is steep. Hereinafter, in the drawings including FIG. 3A illustrating graphs of bandpass characteristics, insertion loss represented on the vertical axis decreases from bottom to top. Furthermore, the first HPF 11 has a wide pass band on a higher frequency side. Therefore, high frequency signals of the HB over a wide frequency range on a higher frequency side may pass through the first path, and high frequency signals of the MB and the LB are able to be attenuated by the first path.

Figure 3B:
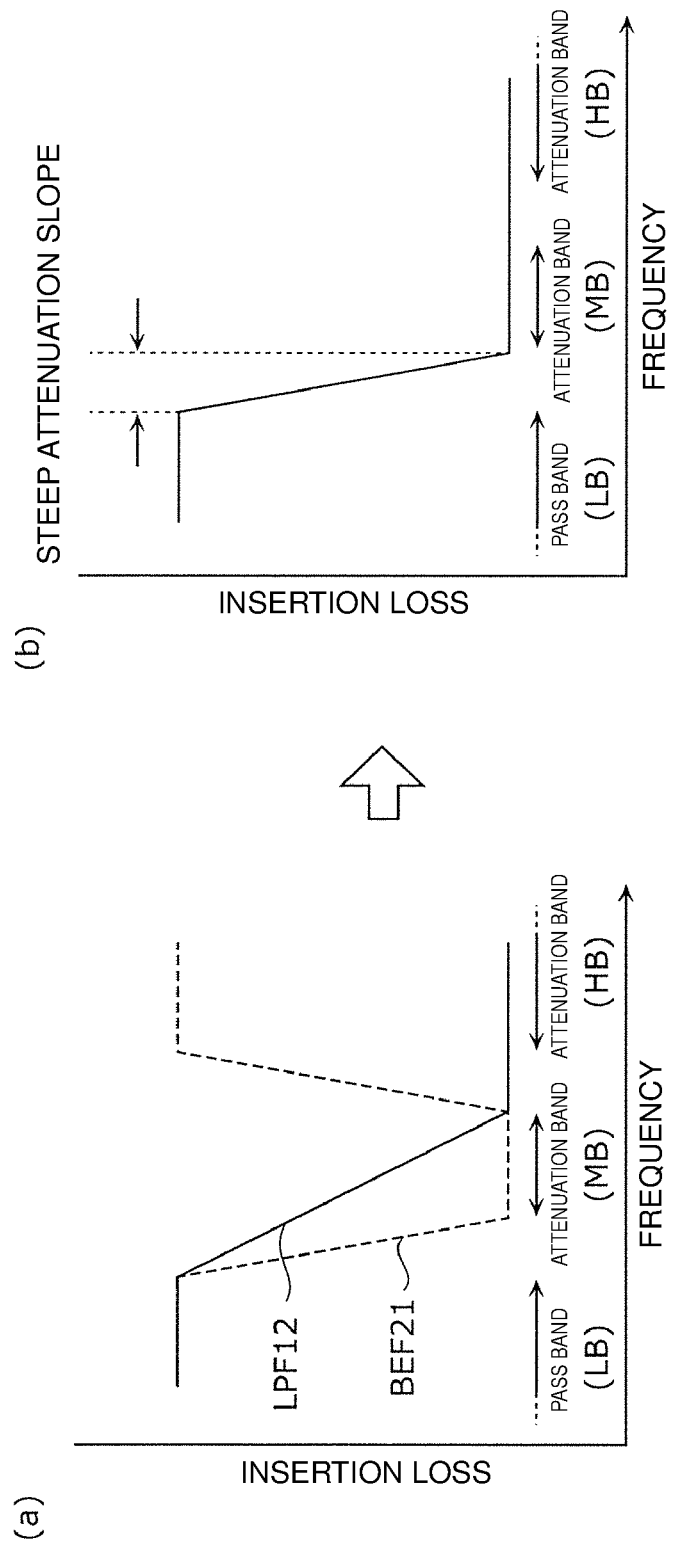
FIG. 3B includes graphs illustrating examples of bandpass characteristics in a second path of the high frequency circuit according to the first preferred embodiment of the present invention.

FIG. 3B includes graphs illustrating examples of bandpass characteristics in the second path of the high frequency circuit 1 according to the first preferred embodiment. Part (a) of FIG. 3B is a graph illustrating the bandpass characteristics of the LPF 12 and the bandpass characteristics of the BEF 21, and Part (b) of FIG. 3B is a graph illustrating the bandpass characteristics in the path (second path) which passes through the LPF 12 and the BEF 21, which are connected in series.

In Part (a) of FIG. 3B, a solid line represents the bandpass characteristics of the LPF 12, and a broken line represents the bandpass characteristics of the BEF 21. The attenuation band of the BEF 21 is located on a high frequency side relative to the pass band of the LPF 12. Specifically, the attenuation slope located within the transition band in the bandpass characteristics of the BEF 21 (a portion where the bandpass characteristics are attenuated from a pass band of the BEF 21 on a lower frequency side toward the attenuation band of the BEF 21) causes the attenuation slope located within the transition band in the bandpass characteristics of the LPF 12 (a portion where the bandpass characteristics are attenuated from the pass band of the LPF 12 toward the attenuation band of the LPF 12) to be attenuated. Accordingly, the attenuation slope located within the transition band in the bandpass characteristics of the LPF 12 is attenuated by the BEF 21. At this time, the steepness of the attenuation slope located within the transition band in the bandpass characteristics of the BEF 21 is high. Therefore, as illustrated in Part (b) of FIG. 3B, the attenuation slope located within the transition band in the bandpass characteristics in the second path is steep. Furthermore, the LPF 12 has a wide pass band on a lower frequency side. Therefore, high frequency signals of the LB over a wide frequency range on a lower frequency side may pass through the second path, and high frequency signals of the MB and the HB are attenuated by the second path.

FIG. 3C is a graph illustrating an example of bandpass characteristics in the third path of the high frequency circuit 1 according to the first preferred embodiment.

In FIG. 3C, a solid line represents the bandpass characteristics of the BPF 22. The steepness of the attenuation slope located within the transition band in the bandpass characteristics of the BPF 22 is high. Therefore, as illustrated in FIG. 3C, the attenuation slope located within the transition band in the bandpass characteristics in the path (third path) which passes through the BPF 22 is high. Furthermore, the pass band of the BPF 22 is located between the pass band of the first HPF 11 and the pass band of the LPF 12, and therefore, high frequency signals of the MB corresponding to the pass band of the BPF 22 may pass through the third path, and high frequency signals of the LB and the HB are attenuated by the third path.

FIGS. 3A to 3C are graphs of the same scale. Therefore, as illustrated in FIGS. 3A to 3C, the attenuation band of the BEF 21 and the pass band of the BPF 22 are located between the pass band of the first HPF 11 and the pass band of the LPF 12. Furthermore, the attenuation slope located within the transition band in the bandpass characteristics of the BEF 21 causes at least one of the attenuation slope located within the transition band in the bandpass characteristics of the first HPF 11 and the attenuation slope located within the transition band in the bandpass characteristics of the LPF 12 to be attenuated. Accordingly, the attenuation slope of the first HPF 11 or the LPF 12 with a low steepness is attenuated by the attenuation slope of the BEF 21 with a high steepness, and the steepness of the attenuation slope is thus increased in the first path or the second path. Furthermore, the steepness of the attenuation slope located within the transition band in the bandpass characteristics of the BPF 22 is high, and therefore, the steepness of the attenuation slope is high in the third path.

Figure 4:
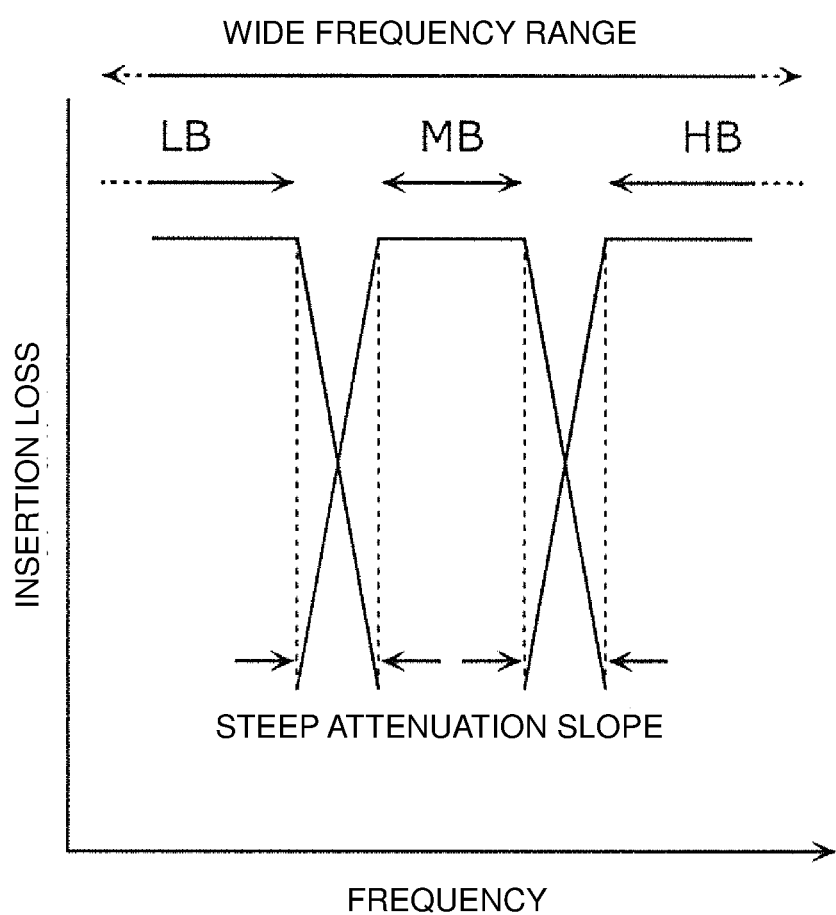
FIG. 4 is a diagram illustrating comparison among the bandpass characteristics in the first to third paths of preferred embodiments of the present invention.

Next, the bandpass characteristics in the first to third paths will be compared with one another with reference to FIG. 4.

FIG. 4 is a diagram illustrating comparison among the bandpass characteristics in the first to third paths.

As described above, a high frequency signal of the HB is transmitted through the first path, a high frequency signal of the LB is transmitted through the second path, and a high frequency signal of the MB is transmitted through the third path. The first HPF 11 has a wide pass band on a higher frequency side, and therefore, high frequency signals of the HB over a wide frequency band range on a higher frequency side pass through the first path. The LPF 12 has a wide pass band on a lower frequency side, and therefore, high frequency signals of the LB over a wide frequency range on a lower frequency side pass through the second path. Furthermore, the pass band of the BPF 22 is located between the pass band of the first HPF 11 and the pass band of the LPF 12, and therefore, high frequency signals of the MB corresponding to the pass band of the BPF 22 pass through the third path. As described above, CA is achieved for signals over a wide frequency range from, for example, low frequency signals of the LB to, for example, high frequency signals of the HB.

Furthermore, the attenuation slope located within the transition band in the bandpass characteristics in the first path is steep, and the attenuation slope located within the transition band in the bandpass characteristics in the third path is steep. Therefore, high frequency signals of the HB passing through the first path and high frequency signals of the MB passing through the third path are less likely to affect each other. Furthermore, the attenuation slope located within the transition band in the bandpass characteristics in the second path is steep, and the attenuation slope located within the transition band in the bandpass characteristics in the third path is steep. Therefore, high frequency signals of the LB passing through the second path and high frequency signal of the MB passing through the third path are less likely to affect each other.

As described above, with a simple configuration in which the first demultiplexing circuit 10 including the first HPF 11 and the LPF 12 is simply connected in series with the second demultiplexing circuit 20 including the BEF 21 and the BPF 22, transmission and reception of a plurality of signals of different frequency bands are able to be performed at the same time, and the steepness of an attenuation slope located within a transition band in bandpass characteristics is increased.

Modification of First Preferred Embodiment

The high frequency circuit 1 according to the first preferred embodiment preferably includes only the first demultiplexing circuit 10 and the second demultiplexing circuit 20. However, a high frequency circuit according to a preferred embodiment of the present invention may further include another component. Furthermore, a high frequency circuit according to a preferred embodiment of the present invention may be applied to a communication apparatus. In a modification of the first preferred embodiment, a high frequency circuit 1a that includes, in addition to the first demultiplexing circuit 10 and the second demultiplexing circuit 20, another component, and a communication apparatus 100 which includes the high frequency circuit 1a will be described.

A configuration of the communication apparatus 100 according to a modification of the first preferred embodiment will be described with reference to FIGS. 5, 6A, and 6B.

Figure 5:
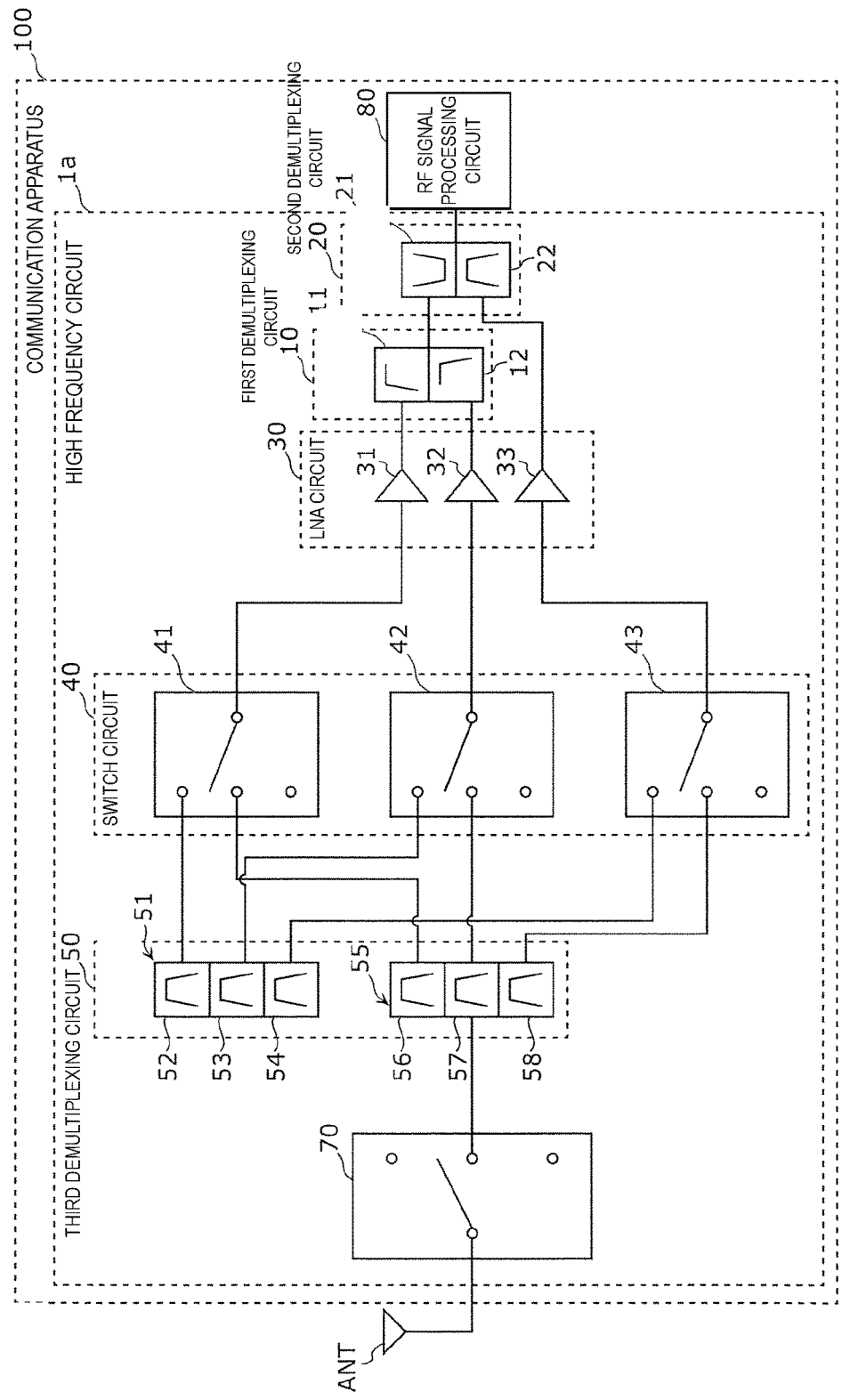
FIG. 5 is a configuration diagram illustrating an example of a communication apparatus according to a modification of the first preferred embodiment of the present invention.

FIG. 5 is a configuration diagram illustrating an example of the communication apparatus 100 according to the modification of the first preferred embodiment. In FIG. 5, an antenna element ANT which is not included in components of the communication apparatus 100 is also illustrated.

The communication apparatus 100 includes the high frequency circuit 1a and an RF signal processing circuit (radio frequency integrated circuit: RFIC) 80.

The high frequency circuit 1a includes the first demultiplexing circuit 10, the second demultiplexing circuit 20, a low noise amplifier (LNA) circuit 30, a switch circuit 40, a third demultiplexing circuit 50, and a switch integrated circuit (IC) 70. That is, the high frequency circuit 1a further includes the LNA circuit 30, the switch circuit 40, the third demultiplexing circuit 50, and the switch IC 70, in addition to the components of the high frequency circuit 1. The first demultiplexing circuit 10 and the second demultiplexing circuit 20 are the same as those in the first preferred embodiment. Therefore, explanation for the first demultiplexing circuit 10 and the second demultiplexing circuit 20 will be omitted.

The switch IC 70 includes a common terminal which is connected to the antenna element ANT and a plurality of selection terminals which are connected to, for example, input terminals of multiplexers 51 and 55 provided in the third demultiplexing circuit 50. The switch IC 70 allows the antenna element ANT to be connected with the multiplexer 51 or 55 corresponding to a predetermined band when the common terminal is connected to any one of the plurality of selection terminals, in accordance with, for example, a control signal from a controller (not illustrated in FIG. 5) provided in the communication apparatus 100.

The third demultiplexing circuit 50 includes BPFs 52 to 54 and BPFs 56 to 58, which are, for example, SAW filters.

The BPFs 52 to 54 define the multiplexer 51, and the BPFs 56 to 58 define the multiplexer 55. In this example, the multiplexers 51 and 55 preferably are triplexers. However, they may be duplexers, quadplexers, or the like. The pass band of each of the BPFs 52 to 54 and the BPFs 56 to 58 is not particularly limited. For example, the BPFs 52 and 56 have pass bands of the HB, the BPFs 53 and 57 have pass bands of the LB, and the BPFs 54 and 58 have pass bands of the MB.

The switch circuit 40 includes switch ICs 41 to 43. For example, the first demultiplexing circuit 10 and the switch circuit 40 may be provided by the same chip. Accordingly, miniaturization of the high frequency circuit 1a is achieved while the high frequency circuit 1a is made more multifunctional, and miniaturization of the communication apparatus 100 is further achieved. In this modification, the switch circuit 40 includes the three switch ICs 41 to 43. However, the present invention is not limited to this. The switch circuit 40 may include two or less switch ICs or four or more switch ICs in accordance with the number of bands handled by the communication apparatus 100.

The switch IC 41 includes a plurality of selection terminals which are connected to output terminals of the BPF 52 and 56 provided in the third demultiplexing circuit 50 and a common terminal which is connected to an input terminal of an LNA 31 provided in the LNA circuit 30. By connecting the common terminal with any one of the plurality of selection terminals, for example, in accordance with a control signal from the controller provided in the communication apparatus 100, the switch IC 41 connects the BPF 52 or 56 corresponding to the HB with the LNA 31.

The switch IC 42 includes a plurality of selection terminals which are connected to output terminals of the BPFs 53 and 57 provided in the third demultiplexing circuit 50 and a common terminal which is connected to an input terminal of an LNA 32 provided in the LNA circuit 30. By connecting the common terminal with any one of the plurality of selection terminals, for example, in accordance with a control signal from the controller provided in the communication apparatus 100, the switch IC 42 connects the BPF 53 or 57 corresponding to the LB with the LNA 32.

The switch IC 43 includes a plurality of selection terminals which are connected to output terminals of the BPFs 54 and 58 provided in the third demultiplexing circuit 50 and a common terminal which is connected to an input terminal of an LNA 33 provided in the LNA circuit 30. By connecting the common terminal with any one of the plurality of selection terminals, for example, in accordance with a control signal from the controller provided in the communication apparatus 100, the switch IC 43 connects the BPF 54 or 58 corresponding to the MB with the LNA 33.

The LNA circuit 30 includes the LNAs 31 to 33, and is, for example, a reception amplification circuit which amplifies high frequency signals of the HB, LB, and MB and outputs the amplified high frequency signals to the first demultiplexing circuit 10 and the second demultiplexing circuit 20. For example, the first demultiplexing circuit 10 and the LNA circuit 30 are provided by the same chip. Accordingly, miniaturization of the high frequency circuit 1a is achieved while the high frequency circuit 1a being made more multifunctional, and miniaturization of the communication apparatus 100 is further achieved. In this modification, the first demultiplexing circuit 10, the LNA circuit 30, and the switch circuit 40 are provided by the same chip. However, only one of the LNA circuit 30 and the switch circuit 40 may be provided by the same chip as the first demultiplexing circuit 10. Furthermore, neither the LNA circuit 30 nor the switch circuit 40 may be provided by the same chip as the first demultiplexing circuit 10.

The RF signal processing circuit 80 performs signal processing, by down-conversion or the like, on a high frequency signal which is input via the high frequency circuit 1a from the antenna element ANT, and outputs a reception signal which is generated by the signal processing to, for example, a baseband signal processing circuit (not illustrated in FIG. 5).

As described above, a high frequency circuit according to a preferred embodiment of the present invention is able to be made more multifunctional and applied to a communication apparatus.

In this preferred embodiment, the high frequency circuit 1a is preferably applied to a reception path. However, the high frequency circuit 1a may be applied to a transmission path. In this case, a power amplifier (hereinafter, may also be referred to as a PA) circuit is provided in place of the LNA circuit 30, and the first demultiplexing circuit 10 and the second demultiplexing circuit 20 are connected directly or indirectly to the antenna element ANT and used to multiplex high frequency signals to the antenna element ANT.

The high frequency circuit 1a may include a multilayer substrate 90 including a plurality of laminated layers. The high frequency circuit 1a may be implemented by, for example, mounting a component on an uppermost layer or a lowermost layer, building a component in an inner layer of the multilayer substrate 90, or providing a wiring pattern in individual layers forming the multilayer substrate 90. The multilayer substrate 90 will be described below with reference to FIGS. 6A and 6B.

Figure 6A:
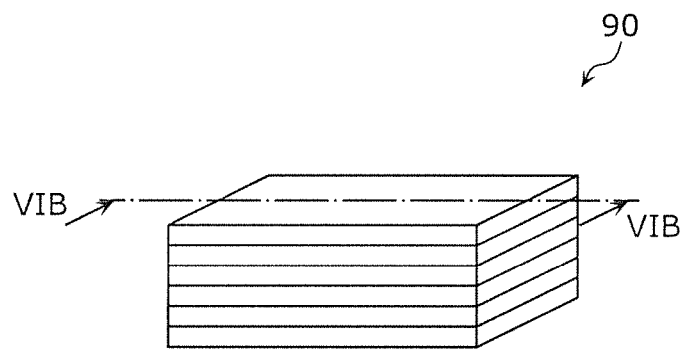
FIG. 6A is a perspective view illustrating an example of a multilayer substrate according to the modification of the first preferred embodiment of the present invention.

FIG. 6A is a perspective view illustrating an example of the multilayer substrate 90 according to a modification of the first preferred embodiment. In FIG. 6A, illustration of components mounted at the multilayer substrate 90, wiring patterns provided at the multilayer substrate 90, and the like is omitted.

Figure 6B:
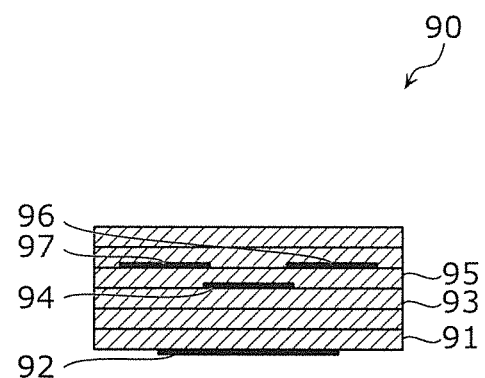
FIG. 6B is a cross-section view taken along line VIB-VIB of FIG. 6A.

FIG. 6B is a cross-section view taken along line VIB-VIB of FIG. 6A. In FIG. 6B, a portion of the wiring pattern provided in the individual layers forming the multilayer substrate 90 is illustrated.

The multilayer substrate 90 includes a reference ground layer 91, which is a lowermost layer of the multilayer substrate 90, a first layer 93, and a second layer 95. In this example, the reference ground layer 91 is the lowermost layer of the multilayer substrate 90. The first layer 93 is closer to the reference ground layer 91 than the second layer 95 is. That is, the first layer 93 is a layer higher than the reference ground layer 91, and the second layer 95 is a layer higher than the first layer 93.

A reference ground pattern 92 having a reference potential of the multilayer substrate 90 is provided on the reference ground layer 91. The reference ground layer 91 connects the reference ground pattern 92 having the reference potential of the high frequency circuit 1a to the ground of a substrate when the high frequency circuit 1a is connected to the substrate or the like.

A ground pattern 94 of the first demultiplexing circuit 10, the ground pattern 94 being electrically connected to the reference ground pattern 92, is provided at the first layer 93. The ground pattern 94 and the reference ground pattern 92 are electrically connected by, for example, an inter-layer connection via. Another layer is interposed between the ground pattern 94 and the reference ground pattern 92, and the ground pattern 94 and the reference ground pattern 92 are thus physically isolated from each other. Therefore, the ground pattern 94 includes a parasitic inductor component.

A ground pattern 96 of the second demultiplexing circuit 20, the ground pattern 96 being electrically connected to the reference ground pattern 92, is provided at the second layer 95. The ground pattern 96 and the reference ground pattern 92 are electrically connected by, for example, an inter-layer connection via. Another layer is interposed between the ground pattern 96 and the reference ground pattern 92, and the ground pattern 96 and the reference ground pattern 92 are thus physically isolated from each other. Therefore, the ground pattern 96 includes a parasitic inductor component. However, the first layer 93 is closer to the reference ground layer 91 than the second layer 95 is, and therefore, the ground pattern 96 includes a parasitic inductor component larger than that of the ground pattern 94. Accordingly, the BEF 21 and the BPF 22 provided at the second demultiplexing circuit 20 are ladder-type SAW filters, and therefore, providing the ground pattern 96 of the second demultiplexing circuit 20 at a position far away from the reference ground layer 91 increases a parasitic inductor component, and the attenuation characteristics outside the pass band of the second demultiplexing circuit 20 is improved.

Furthermore, a ground pattern 97 of the third demultiplexing circuit 50, the ground pattern 97 being electrically connected to the reference ground pattern 92, is provided at the second layer 95. That is, the ground pattern 96 and the ground pattern 97 are provided at a layer (second layer 95) of the plurality of layers of the multilayer substrate 90. Furthermore, the ground pattern 96 and the ground pattern 97 are provided at the second layer 95 such that the ground pattern 96 and the ground pattern 97 are isolated from each other. That is, the ground pattern 96 and the ground pattern 97 are not connected at the second layer 95. Accordingly, coupling between the second demultiplexing circuit 20 and the third demultiplexing circuit 50 by the ground pattern 96 and the ground pattern 97 is reduced or prevented, and improvement of reception sensitivity and the like is achieved.

By providing the ground patterns at the multilayer substrate 90 for the first demultiplexing circuit 10, the second demultiplexing circuit 20, the third demultiplexing circuit 50, and the like provided in the high frequency circuit 1a as described above, the high frequency circuit 1a which attains both attenuation characteristics and bandpass characteristics is achieved.

Second Preferred Embodiment

The high frequency circuit 1 according to the first preferred embodiment, for example, combines a plurality of signal paths through which high frequency signals of different frequency bands are transmitted into a single signal path. However, a high frequency circuit according to a preferred embodiment of the present invention may divide a single signal path into a plurality of signal paths through which high frequency signals of different frequency bands are transmitted. In a second preferred embodiment, a high frequency circuit 2 which divides a signal path into a plurality of signal paths through which high frequency signals of different frequency bands are transmitted will be described.

A configuration of the high frequency circuit 2 according to the second preferred embodiment will be described with reference to FIG. 7.

Figure 7:
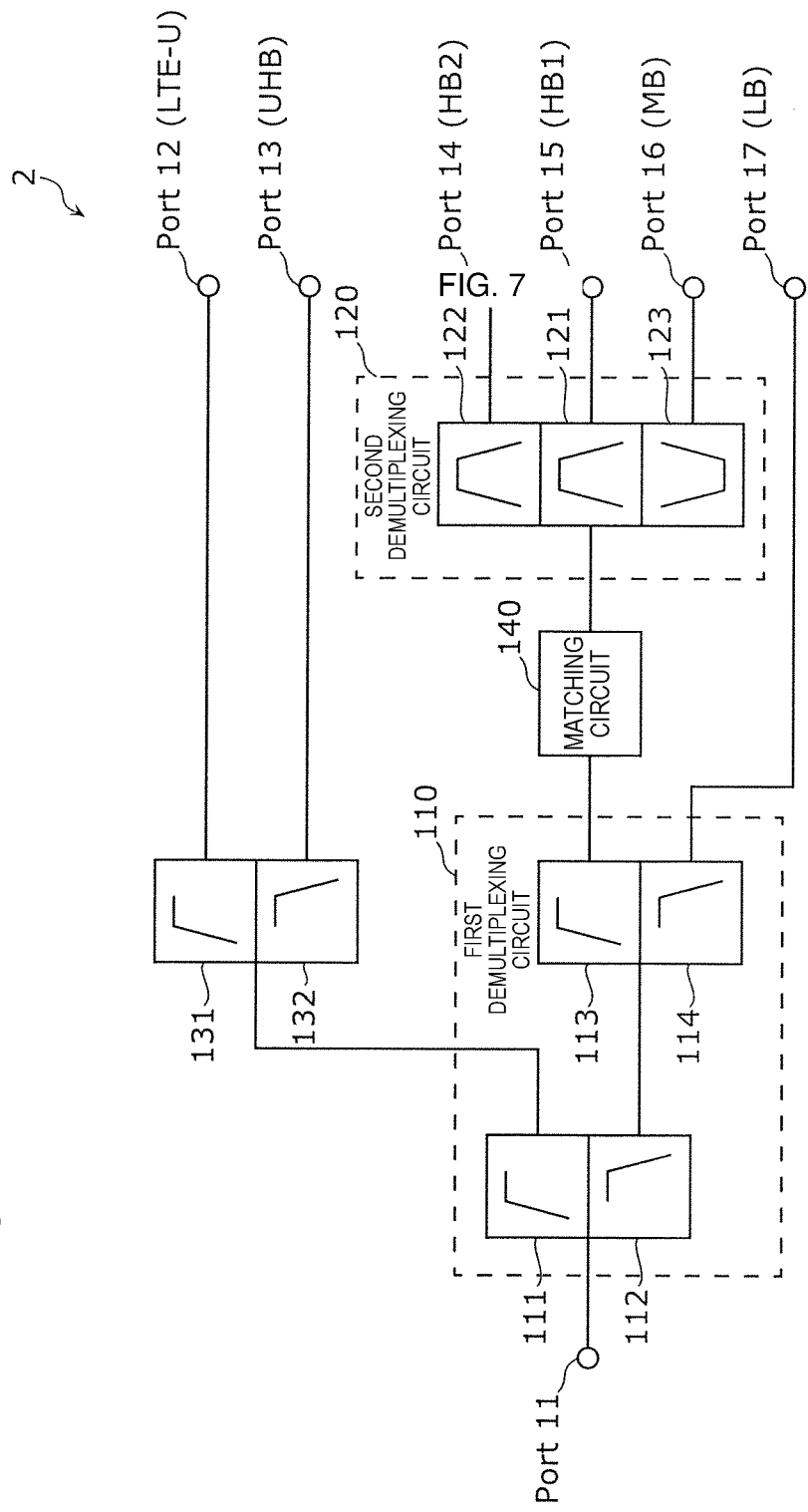
FIG. 7 is a configuration diagram illustrating an example of a high frequency circuit according to a second preferred embodiment of the present invention.

FIG. 7 is a configuration diagram illustrating an example of the high frequency circuit 2 according to the second preferred embodiment.

The high frequency circuit 2 includes a first demultiplexing circuit 110 and a second demultiplexing circuit 120 which is connected in series with the first demultiplexing circuit 110. Furthermore, the high frequency circuit 2 includes an HPF 131, an LPF 132, and a matching circuit 140. The high frequency circuit 2 includes terminals Port 11 to Port 17. For example, an antenna element is connected to the terminal Port 11. Furthermore, high frequency signals of different frequency bands are transmitted through signal paths passing through the terminals Port 12 to Port 17. In this preferred embodiment, the high frequency circuit 2 is applied to a reception path and has a function of demultiplexing a high frequency signal input to the terminal Port 11 and outputting the resultant signals from the terminals Port 12 to Port 17. The high frequency circuit 2 may be applied to a transmission path and may have a function of multiplexing high frequency signals input to the terminals Port 12 to Port 17 and outputting the resultant signal from the terminal Port 11.

For example, a high frequency signal of LTE-U (LTE-Unlicensed) is transmitted through a signal path which passes through the terminal Port 12. For example, a high frequency signal of an ultra high band (UHB) is transmitted through a signal path which passes through the terminal Port 13. For example, a high frequency signal of HB 2 is transmitted through a signal path which passes through the terminal Port 14. For example, a high frequency signal of HB 1 is transmitted through a signal path which passes through the terminal Port 15. For example, a high frequency signal of the MB is transmitted through a signal path which passes through the terminal Port 16. For example, a high frequency signal of the LB is transmitted through a signal path which passes through the terminal Port 17. For example, the LTE-U is a frequency band of about 5 GHz, the UHB is a frequency band of about 2700 MHz to about 3800 MHz, the HB 2 is a frequency band of about 2496 MHz to about 2690 MHz, the HB 1 is a frequency band of about 2300 MHz to about 2400 MHz, the MB is a frequency band of about 1710 MHz to about 2170 MHz, and the LB is a frequency band of about 699 MHz to about 960 MHz. The above frequency bands are merely examples, and preferred embodiments of the present invention may also be applied to other frequency bands. The high frequency circuit 2 is, for example, a circuit which causes a signal path which is connected to the terminal Port 11 to branch off to the terminals Port 12 to Port 17.

The first demultiplexing circuit 110 includes a first HPF 111, a first LPF 112, a second HPF 113, and a LPF 114. The first HPF 111, the LPF 112, the second HPF 113, and the LPF 114 are, for example, LC resonance circuits. Accordingly, the first HPF 111 and the second HPF 113 having wide pass bands on a higher frequency side and the LPF 112 and the LPF 114 having wide pass bands on a lower frequency side are able to be implemented easily, and CA is achieved for signals over a wide range from signals of a lower frequency band to signals of a higher frequency band. However, the bandpass characteristics of the first HPF 111, the first LPF 112, the second HPF 113, and the LPF 114 exhibit a low steepness of an attenuation slope. The circuit configuration of the first HPF 111, the first LPF 112, the second HPF 113, and the LPF 114 is a general circuit configuration in which an inductor and a capacitor are connected in series or parallel. Therefore, illustration of the circuit configuration of the first HPF 111, the first LPF 112, the second HPF 113, and the LPF 114 will be omitted.

The second demultiplexing circuit 120 includes the BEF 123 and a BPF. In this preferred embodiment, the BPF includes a first BPF 121 and a second BPF 122 which have different pass bands. At least one of the BEF 123, the first BPF 121, and the second BPF 122 includes an elastic wave resonator. In this preferred embodiment, for example, each of the BEF 123, the first BPF 121, and the second BPF 122 includes a SAW resonator. The circuit configuration of the BEF 123 is the same as, for example, the circuit configuration illustrated in FIG. 2A, and the circuit configuration of each of the first BPF 121 and the second BPF 122 is the same as, for example, the circuit configuration illustrated in FIG. 2B. Therefore, explanation for the circuit configuration of each of the BEF 123, the first BPF 121, and the second BPF 122 will be omitted.

The high frequency circuit 2 is a multiplexer which performs transmission, reception, or both transmission and reception of a plurality of signals at the same time.

A filter including a SAW resonator includes a substrate and an IDT electrode. The substrate has piezoelectricity at least on the surface thereof. For example, the substrate may be a multilayer body including a piezoelectric thin film provided at the surface, a film having an acoustic velocity different from that of the piezoelectric thin film, a supporting substrate, and the like. Furthermore, for example, the entire substrate may have piezoelectricity. In this case, the substrate may be a piezoelectric substrate defined by a single piezoelectric body layer.

The first HPF 111 and the first LPF 112, the second HPF 113 and the LPF 114, the HPF 131 and the LPF 132, and the first BPF 121, the second BPF 122, and the BEF 123 each include a common terminal (input terminal). An output terminal of the first HPF 111 is connected to the common terminal of the HPF 131 and the LPF 132. An output terminal of the first LPF 112 is connected to the common terminal of the second HPF 113 and the LPF 114. An output terminal of the second HPF 113 is connected to the common terminal of the first BPF 121, the second BPF 122, and the BEF 123. In this preferred embodiment, series connection between the first demultiplexing circuit 110 and the second demultiplexing circuit 120 represents connection between the output terminal of the second HPF 113 and the common terminal of the first BPF 121, the second BPF 122, and the BEF 123. In this preferred embodiment, the output terminal of the second HPF 113 and the common terminal of the first BPF 121, the second BPF 122, and the BEF 123 are connected with the matching circuit 140 interposed therebetween.

The matching circuit 140 is a circuit that achieves each impedance matching of the first BPF 121, the second BPF 122, and the BEF 123, and is connected to the first BPF 121 and the second BPF 122. The matching circuit 140 is, for example, a circuit which includes at least one of a shunt inductor, a shunt capacitor, inductors connected in series, and capacitors connected in series.

Next, the bandpass characteristics of the high frequency circuit 2 will be explained with reference to FIGS. 8A and 8B.

Figure 8A:
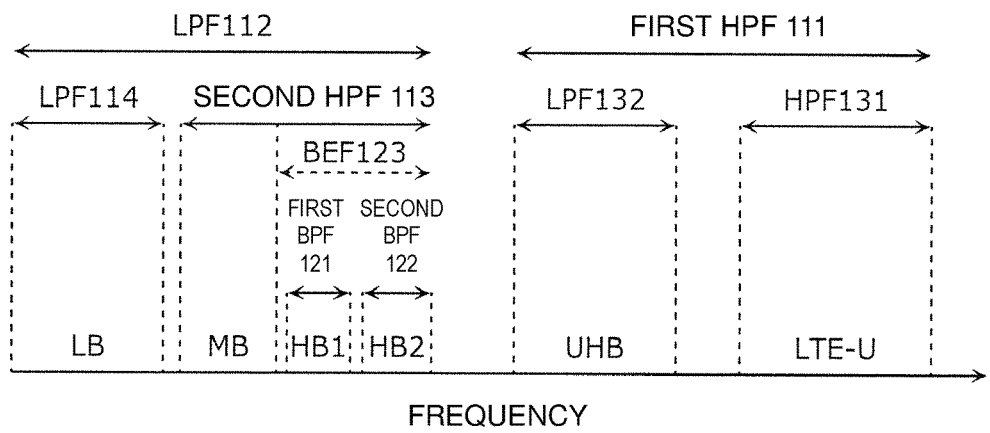
FIGS. 8A and 8B are diagrams for explaining bandpass characteristics of the high frequency circuit according to the second preferred embodiment of the present invention.
Figure 8B:
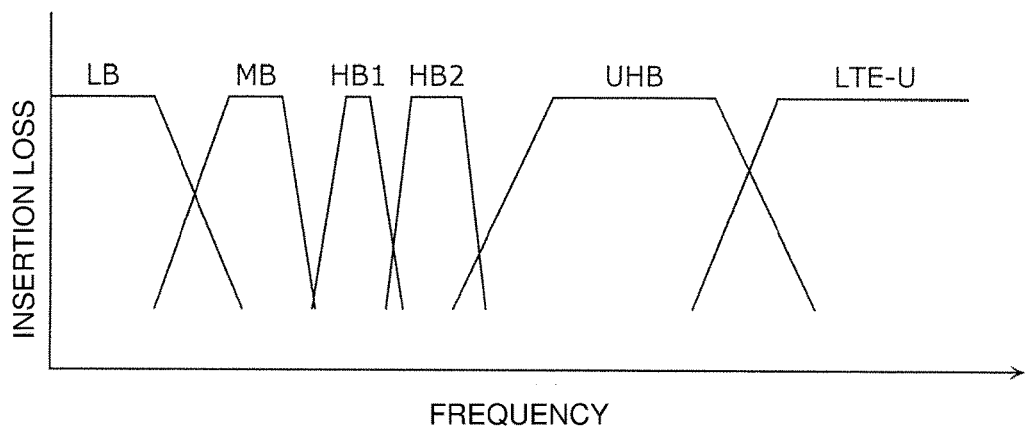

FIGS. 8A and 8B are diagrams for explaining the bandpass characteristics of the high frequency circuit 2 according to the second preferred embodiment. FIG. 8A schematically illustrates pass bands of individual filters (for the BEF 123, an attenuation band) provided in the high frequency circuit 2. FIG. 8B illustrates comparison among bandpass characteristics in individual paths connecting the terminal Port 11 with the terminals Port 12 to Port 17 of the high frequency circuit 2.

As illustrated in FIG. 8A, the pass band of the first HPF 111 is located on a high frequency side relative to the pass band of the LPF 112, the pass band of the HPF 131 is located on a high frequency side relative to the pass band of the LPF 132, and the pass band of the first HPF 111 overlaps with the pass band of the LPF 132 and the pass band of the HPF 131. Accordingly, a pass band in the path passing through the first HPF 111 and the HPF 131 that are connected in series is an LTE-U, and the pass band in the path passing through the first HPF 111 and the LPF 132 that are connected in series is a UHB.

Furthermore, the pass band of the second HPF 113 is located between the pass band of the first HPF 111 and the pass band of the LPF 114, and the pass band of the LPF 112 overlaps with the pass band of the LPF 114 and the pass band of the second HPF 113. Accordingly, the pass band in the path passing through the LPF 112 and the LPF 114 that are connected in series is an LB.

Furthermore, the pass band of the second HPF 113, the pass bands of the first BPF 121 and the second BPF 122, and the attenuation band of the BEF 123 overlap. Accordingly, the pass band in the path passing through the LPF 112, the second HPF 113, and the BEF 123 that are connected in series is an MB. The pass band in the path passing through the LPF 112, the second HPF 113, and the first BPF 121 that are connected in series is an HB 1. The pass band in the path passing through the LPF 112, the second HPF 113, and the second BPF 122 that are connected in series is an HB 2. The pass band of the first HPF 111 is located on a high frequency side relative to the pass band of the LPF 114, and the attenuation band of the BEF 123 and the pass band of the BPF (the first BPF 121 and the second BPF 122) are located between the pass band of the first HPF 111 and the pass band of the LPF 114.

With this configuration, as illustrated in FIG. 8B, the high frequency circuit 2 achieves CA for signals over a wide frequency range from, for example, low frequency signals of the LB to, for example, high frequency signals of the LTE-U. Furthermore, the attenuation band of the BEF 123 and the pass bands (HB1 and HB2) of the first BPF 121 and the second BPF 122, respectively, overlap, and therefore, the pass band of the first BPF 121 and the pass band of the second BPF 122 do not overlap with a band (MB) other than the attenuation band of the BEF 123 in the pass band of the second HPF 113. Accordingly, a signal containing a frequency component of the pass band of the first BPF 121 or the second BPF 122 and a signal containing a frequency component of a band (MB) other than the attenuation band of the BEF 123 in the pass band of the second HPF 113 are less likely to affect each other. Furthermore, a portion of the pass band of the second HPF 113 is attenuated by an attenuation slope with a high steepness of the BEF 123, and therefore, the steepness of the attenuation slope of the second HPF 113 and the BEF 123 that are connected in series is high, as with the steepness of the attenuation slope on a higher frequency side of the bandpass characteristics of the MB illustrated in FIG. 8B. Accordingly, a high frequency signal of the MB and a high frequency signal of the HB 1 are less likely to affect each other. Furthermore, the steepness of the attenuation slope of each of the first BPF 121 and the second BPF 122 is high, and therefore, a high frequency signal of the HB 1 and a high frequency signal of the HB 2 are less likely to affect each other.

As illustrated in FIG. 8A, a portion of the pass band of band pass filter(s) (first BPF 121, second BPF 122, or both first BPF 121 and second BPF 122) overlaps with a portion of the attenuation band of the band eliminator filter (BEF 123). With this structure, insertion loss of the band pass filter(s) is improved.

As illustrated in FIG. 8A, a portion of the pass band, which is a band different from the attenuation band of the band elimination filter (BEF 123), is lower than the pass band of the band pass filter(s) (first BPF 121, second BPF 122, or both first BPF 121 and second BPF 122).

In the high frequency circuit 2 according to the second preferred embodiment, a band eliminator filter (BEF 123) is preferably used. In the case where the band elimination filter (BEF 123) is an LC filter, a wide pass band is achieved. For frequency allocation of the LTE, the bandwidth of the MB is greater than the bandwidth of the HB. Therefore, by using a band elimination filter for the MB with a wide bandwidth and using a band pass filter for the HB with a bandwidth narrower than the MB, the high frequency circuit 2 may become appropriate for carrier aggregation of the MB and the HB in the LTE.

As described above, with a simple configuration in which the first demultiplexing circuit 110 including the first HPF 111, the first LPF 112, the LPF 114, and the second HPF 113 and the second demultiplexing circuit 120 including the first BPF 121, the second BPF 122, and the BEF 123 are connected in series, transmission and reception of a plurality of signals of different frequency bands may be performed at the same time, and the steepness of an attenuation slope located within a transition band in bandpass characteristics is able to be increased.

Next, the positional relationship of the matching circuit 140 and the first BPF 121 or the second BPF 122 will be described with reference to FIG. 9.

Figure 9:
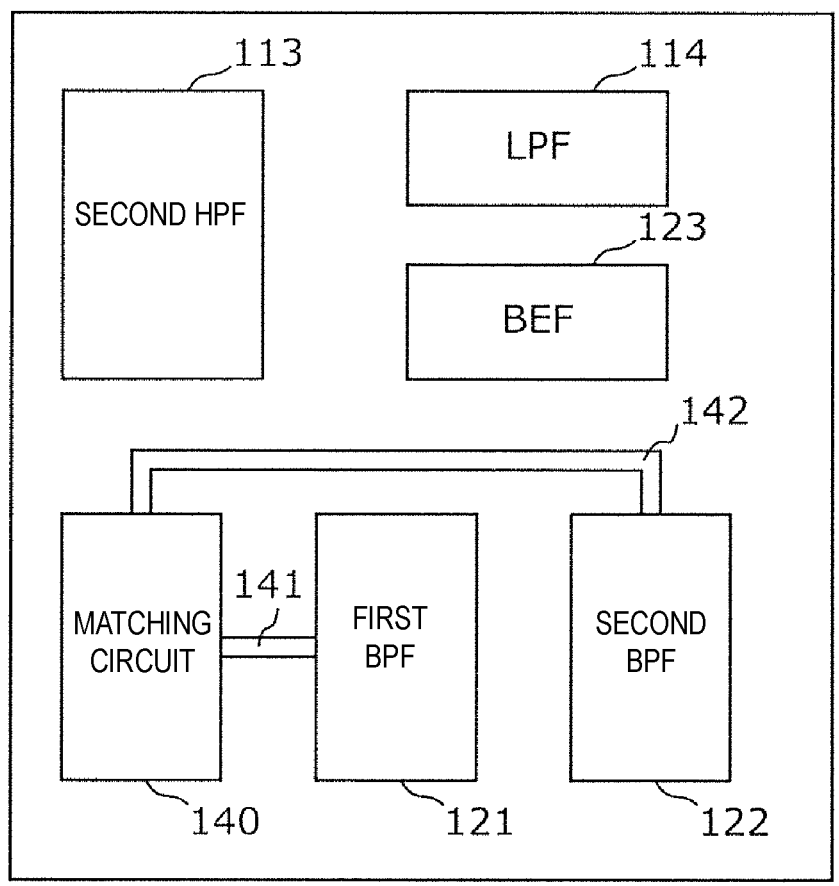
FIG. 9 is an arrangement diagram illustrating an example of the high frequency circuit according to the second preferred embodiment of the present invention.

FIG. 9 is an arrangement diagram illustrating an example of the high frequency circuit 2 according to the second preferred embodiment. FIG. 9 schematically illustrates the arrangement of some components of the high frequency circuit 2 on a substrate in a case where the high frequency circuit 2 is implemented by a multilayer substrate or the like. In FIG. 9, wiring 141 which connects the matching circuit 140 with the first BPF 121 and wiring 142 which connects the matching circuit 140 with the second BPF 122 are illustrated.

As illustrated in FIG. 8A, the pass band of the first BPF 121, among the pass band of the first BPF 121 and the pass band of the second BPF 122, is located closer to a desired pass band of the BEF 123 (a range except for a broken-line arrow of the BEF 123 in the pass band of the second HPF 113, for example, the range of the MB in FIG. 8A). Accordingly, the first BPF 121 is more likely to affect the BEF 123 than the second BPF 122 is. For example, in the case where the wiring 141 which connects the matching circuit 140 with the first BPF 121 is long, in response to the amount of variations in the impedance by the wiring 141, the amount of adjustment in the impedance matching of the first BPF 121 by the matching circuit 140 are increased. In this case, the BEF 123 whose pass band is located close to the pass band of the first BPF 121 is affected by the impedance matching for the long wiring 141.

In contrast, among the pass band of the first BPF 121 and the pass band of the second BPF 122, the pass band of the second BPF 122 is located farther away from the desired pass band of the BEF 123, and therefore, the second BPF 122 is less likely to affect the BEF 123 than the first BPF 121 is. Accordingly, even in the case where the wiring 142 which connects the matching circuit 140 with the second BPF 122 is long, the BEF 123 whose pass band is not located close to the pass band of the second BPF 122 is less likely to be affected by the impedance matching for the wiring 142.

Thus, as illustrated in FIG. 9, the wiring 141 which connects the matching circuit 140 with the first BPF 121 is preferably shorter than the wiring 142 which connects the matching circuit 140 with the second BPF 122. Accordingly, the amount of adjustment in the impedance matching of the first BPF 121 by the wiring 141 is reduced, and the influence of the impedance matching of the first BPF 121 on the BEF 123 is reduced.

Next, other features of the high frequency circuit 2 will be explained with reference to FIG. 10.

Figure 10:
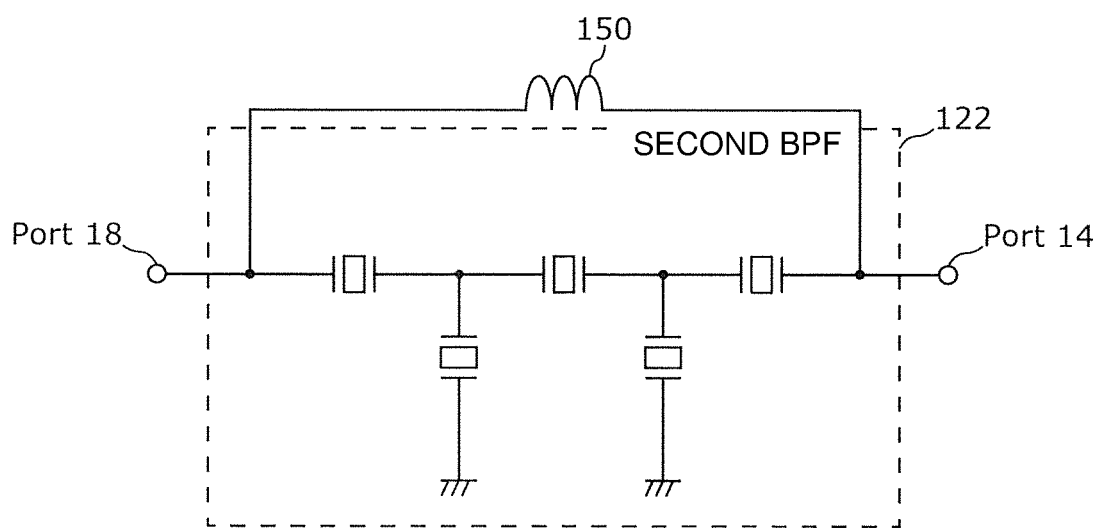
FIG. 10 is a circuit diagram illustrating an example of a circuit in which an inductor is connected in parallel with a second BPF.

FIG. 10 is a circuit diagram illustrating an example of a circuit in which an inductor 150 is connected in parallel with the second BPF 122. As described above, the circuit configuration of the second BPF 122 is the same as, for example, the circuit configuration illustrated in FIG. 2B. Therefore, explanation for the circuit configuration of the second BPF 122 will be omitted. The terminal Port 14 corresponds to the terminal Port 14 illustrated in FIG. 7. A terminal Port 18 is, although not being illustrated in FIG. 7, a terminal of the second BPF 122 that is connected to the matching circuit 140. Furthermore, in FIG. 7, illustration of the inductor 150 is omitted.

In general, when the range of the pass band of a BPF is increased, the attenuation in a region other than the pass band is reduced. Thus, even in the case where the range of the pass band of the BPF is increased, by connecting an inductor having an attenuation pole in the region other than the pass band in parallel with the BPF, the attenuation in the region other than the pass band is increased by the inductor and a parasitic capacitance component generated when the inductor is connected.

In this preferred embodiment, as illustrated in FIG. 8B, the pass band (HB 2) of the second BPF 122 is wider than the pass band (HB 1) of the first BPF 121. Thus, as illustrated in FIG. 10, the inductor 150 is connected in parallel with the second BPF 122 with a wider pass band. Accordingly, the attenuation in the region other than the pass band, which is reduced by the increase in the range of the pass band of the second BPF 122, is increased. The inductor 150 may be connected in parallel with the first BPF 121 or may be connected in parallel with each of the first BPF 121 and the second BPF 122.

Modification of Second Preferred Embodiment

The high frequency circuit 2 according to the second preferred embodiment includes the first demultiplexing circuit 110 and the second demultiplexing circuit 120, which are minimum required components. However, a high frequency circuit according to a preferred embodiment of the present invention may further include another component. Furthermore, a high frequency circuit according to a preferred embodiment of the present invention may be applied to a communication apparatus. In a modification of the second preferred embodiment, a high frequency circuit 2a that includes, in addition to the first demultiplexing circuit 110 and the second demultiplexing circuit 120, another component, and a communication apparatus 200 which includes the high frequency circuit 2a will be described.

A configuration of the communication apparatus 200 according to a modification of the second preferred embodiment will be described with reference to FIG. 11.

Figure 11:
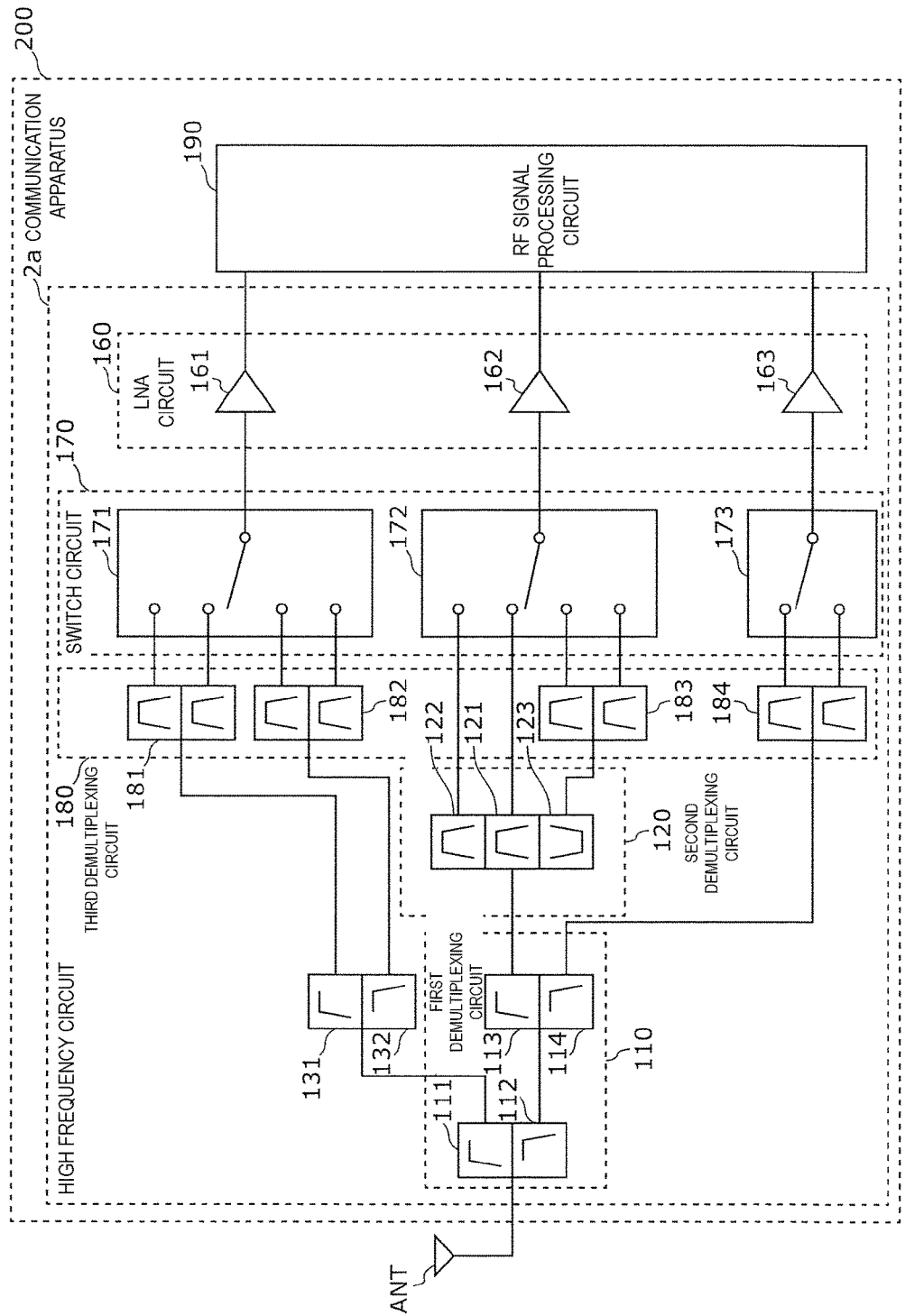
FIG. 11 is a configuration diagram illustrating an example of a communication apparatus according to a modification of the second preferred embodiment of the present invention.

FIG. 11 is a configuration diagram illustrating an example of the communication apparatus 200 according to the modification of the second preferred embodiment. In FIG. 11, an antenna element ANT which is not included in components of the communication apparatus 200 is also illustrated.

The communication apparatus 200 includes the high frequency circuit 2a and an RF signal processing circuit 190.

The high frequency circuit 2a includes the first demultiplexing circuit 110, the second demultiplexing circuit 120, the HPF 131, the LPF 132, an LNA circuit 160, a switch circuit 170, and a third demultiplexing circuit 180. That is, the high frequency circuit 2a further includes the LNA circuit 160, the switch circuit 170, and the third demultiplexing circuit 180, in addition to the components of the high frequency circuit 2. The first demultiplexing circuit 110, the second demultiplexing circuit 120, the HPF 131, and the LPF 132 are the same as those in the second preferred embodiment, and therefore, explanation for the first demultiplexing circuit 110, the second demultiplexing circuit 120, the HPF 131, and the LPF 132 will be omitted.

The third demultiplexing circuit 180 includes, for example, duplexers 181 to 184. The duplexer 181 is a filter which demultiplexes, for example, a high frequency signal of the LTE-U. The duplexer 182 is a filter which demultiplexes, for example, a high frequency signal of the UHB. The duplexer 183 is a filter which demultiplexes, for example, a high frequency signal of the MB. The duplexer 184 is a filter which demultiplexes, for example, a high frequency signal of the LB. The duplexers 181 to 184 may demultiplex high frequency signals of a wide frequency band such as the LTE-U into high frequency signals of a specific narrow frequency band.

The switch circuit 170 includes switch ICs 171 to 173. For example, the first demultiplexing circuit 110 and the switch circuit 170 are provided by the same chip. In this modification, the switch circuit 170 preferably includes the three switch ICs 171 to 173, for example. However, the present invention is not limited to this. The switch circuit 170 may include two or less switch ICs or four or more switch ICs in accordance with the number of bands handled by the communication apparatus 200.

The switch IC 171 includes a plurality of selection terminals which are connected to output terminals of the duplexers 181 and 182 provided in the third demultiplexing circuit 180 and a common terminal which is connected to an input terminal of an LNA 161 provided in the LNA circuit 160. The switch IC 171 allows one of the filters of the duplexer 181 corresponding to the LTE-U and the filters of the duplexer 182 corresponding to the UHB to be connected with the LNA 161 when the common terminal is connected with any one of the plurality of selection terminals, in accordance with, for example, a control signal from a controller (not illustrated in FIG. 11) provided in the communication apparatus 200.

The switch IC 172 includes a plurality of selection terminals which are connected to output terminals of the first BPF 121 and the second BPF 122 provided in the second demultiplexing circuit 120 and the duplexer 183 provided in the third demultiplexing circuit 180 and a common terminal which is connected to an input terminal of an LNA 162 provided in the LNA circuit 160. The switch IC 172 allows one of the first BPF 121 corresponding to the HB 1, the second BPF 122 corresponding to the HB 2, and the filters of the duplexer 183 corresponding to the MB to be connected with the LNA 162 when the common terminal is connected with any one of the plurality of selection terminals, in accordance with, for example, a control signal from the controller provided in the communication apparatus 200.

The switch IC 173 includes a plurality of selection terminals which are connected to output terminals of the duplexer 184 provided in the third demultiplexing circuit 180 and a common terminal which is connected to an input terminal of an LNA 163 provided in the LNA circuit 160. The switch IC 173 allows one of the filters of the duplexer 184 corresponding to the LB to be connected with the LNA 163 when the common terminal is connected with any one of the plurality of selection terminals in accordance with, for example, a control signal from the controller provided in the communication apparatus 200.

The LNA circuit 160 includes the LNAs 161 to 163, and is, for example, a reception amplification circuit which amplifies high frequency signals of a range from the LB to the LTE-U and outputs the resultant signals to the RF signal processing circuit 190. For example, the first demultiplexing circuit 110 and the LNA circuit 160 are provided by the same chip. In this modification, the first demultiplexing circuit 110, the LNA circuit 160, and the switch circuit 170 are provided by the same chip. However, only one of the LNA circuit 160 and the switch circuit 170 may be provided by the same chip as that of the first demultiplexing circuit 110. Furthermore, neither of the LNA circuit 160 nor the switch circuit 170 may be provided by the same chip as that of the first demultiplexing circuit 110.

The RF signal processing circuit 190 performs signal processing, by down-conversion or the like, on a high frequency signal which is input via the high frequency circuit 2a from the antenna element ANT, and outputs a reception signal which is generated by the signal processing to, for example, a baseband signal processing circuit (not illustrated in FIG. 11).

As described above, a high frequency circuit according to a preferred embodiment of the present invention may be made multifunctional and applied to a communication apparatus.

In this preferred embodiment, the high frequency circuit 2a is preferably applied to a reception path. However, the high frequency circuit 2a may be applied to a transmission path. In this case, a PA circuit is provided in place of the LNA circuit 160, and the first demultiplexing circuit 110 and the second demultiplexing circuit 120 are used to multiplex high frequency signals to the antenna element ANT.

Other Preferred Embodiments

High frequency circuits and communication apparatuses according to the foregoing preferred embodiments have been described above. However, the present invention is not limited to the foregoing preferred embodiments.

For example, in the first preferred embodiment and the modification of the first preferred embodiment, the second demultiplexing circuit 20 includes a single BPF 22. However, the present invention is not limited to this. The second demultiplexing circuit 20 may include a plurality of BPFs.

Furthermore, for example, in the second preferred embodiment and the modification of the second preferred embodiment, the second demultiplexing circuit 120 includes the first BPF 121 and the second BPF 122. However, the present invention is not limited to this. The second demultiplexing circuit 120 may include a single BPF or three or more BPFs.

Furthermore, in the second preferred embodiment and the modification of the second preferred embodiment, the high frequency circuit 2 (2a) includes the HPF 131 and the LPF 132. However, the present invention is not limited this. The high frequency circuit 2 (2a) may not include the HPF 131 or the LPF 132.

Furthermore, for example, in the second preferred embodiment and the modification of the second preferred embodiment, the inductor 150 is connected in parallel with the second BPF 122. However, the present invention is not limited to this. The inductor 150 may not be connected to the second BPF 122.

Furthermore, for example, in the second preferred embodiment, the high frequency circuit 2 includes the matching circuit 140. However, the present invention is not limited to this. The high frequency circuit 2 may not include the matching circuit 140.

Furthermore, in the second preferred embodiment and the modification of the second preferred embodiment, the first demultiplexing circuit 110 includes the LPF 112. However, the present invention is not limited to this. The first demultiplexing circuit 110 may not include the LPF 112. That is, the first HPF 111, the second HPF 113, and the LPF 114 may include a common terminal (input terminal). Furthermore, the first demultiplexing circuit 110 may not include the first HPF 111. A high frequency circuit in which a first demultiplexing circuit does not include the first HPF 111 and the first LPF 112 will be described with reference to FIG. 12.

Figure 12:
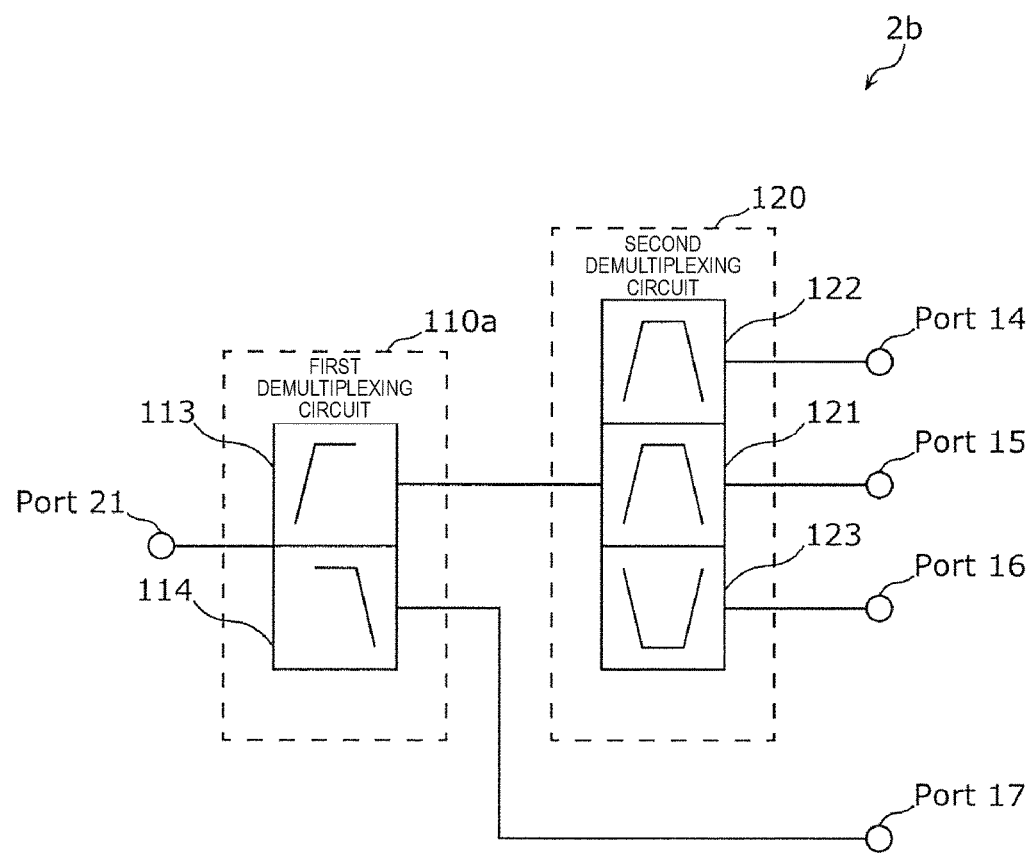
FIG. 12 is a configuration diagram illustrating an example of a high frequency circuit according to another preferred embodiment of the present invention.

FIG. 12 is a configuration diagram illustrating an example of a high frequency circuit 2b according to another preferred embodiment of the present invention.

As illustrated in FIG. 12, the high frequency circuit 2b includes a first demultiplexing circuit 110a which includes the second HPF 113 and the LPF 114. Furthermore, the high frequency circuit 2b includes the second demultiplexing circuit 120 which is connected in series with the first demultiplexing circuit 110a and includes the BEF 123 and a BPF. The BPF includes the first BPF 121 and the second BPF 122 which have different pass bands. At least one of the BEF 123, the first BPF 121, and the second BPF 122 includes an elastic wave resonator.

Furthermore, the pass band of the second HPF 113 is located on a high frequency side relative to the pass band of the LPF 114, the attenuation band of the BEF 123 and the pass bands of the first BPF 121 and the second BPF 122 are located on a high frequency side relative to the pass band of the LPF 114 and overlap with the pass band of the second HPF 113. Accordingly, bandpass characteristics in individual paths connecting the terminal Port 21 with the terminals Port 14 to Port 17 of the high frequency circuit 2b are equal to bandpass characteristics except for the UHB and the LTE-U illustrated in FIG. 8B.

In the high frequency circuit 2b in FIG. 12, one signal path is divided into four signal paths. That is, the high frequency circuit 2b in FIG. 12 is a multiplexer and is a quadplexer which divides one signal path into four signal paths.

For example, a high frequency signal of the HB 2 is transmitted through a signal path passing through the terminal Port 14. For example, a high frequency signal of the HB 1 is transmitted through a signal path passing through the terminal Port 15. For example, a high frequency signal of the MB is transmitted through a signal path passing through the terminal Port 16. For example, a high frequency signal of the LB is transmitted through a signal path passing through the terminal Port 17. For example, the HB 2 represents a frequency band from about 2496 MHz to about 2690 MHz, the HB 1 represents a frequency band from about 2300 MHz to about 2400 MHz, the MB represents a frequency band from about 1427 MHz to about 2200 MHz, and the LB represents a frequency band from about 452 MHz to about 960 MHz. With this configuration, carrier aggregation which implements transmission, reception, or both transmission and reception of four signals having pass bands of different frequency bands at the same time is achieved.

With the above configuration, the high frequency circuit 2b may achieve CA for signals over a wide frequency range from, for example, low frequency signals of the LB to, for example, high frequency signals of the HB 2. Furthermore, the attenuation band of the BEF 123, the pass band (HB 1) of the first BPF 121, and the pass band (HB 2) of the second BPF 122 overlap, and therefore, the pass band of the first BPF 121 and the pass band of the second BPF 122 do not overlap with a band (MB) other than the attenuation band of the BEF 123 in the pass band of the second HPF 113. Accordingly, signals containing a frequency component of the pass band of the first BPF 121 or the second BPF 122 and a signal containing a frequency component of a band (MB) other than the attenuation band of the BEF 123 in the pass band of the second HPF 113 are less likely to affect each other. Furthermore, a portion of the pass band of the second HPF 113 is attenuated by an attenuation slope of the BEF 123 with a high steepness, and therefore, the steepness of the attenuation slopes of the second HPF 113 and the BEF 123 which are connected in series is increased. Accordingly, a high frequency signal of the MB and a high frequency signal of the HB 1 are less likely to affect each other. Furthermore, the steepness of the attenuation slopes of the first BPF 121 and the second BPF 122 is high, and therefore, a high frequency signal of the HB 1 and a high frequency signal of the HB 2 are less likely to affect each other.

As described above, with a simple configuration in which the first demultiplexing circuit 110a which includes the second HPF 113 and the LPF 114 and the second demultiplexing circuit 120 which includes the first BPF 121, the second BPF 122, and the BEF 123 are connected in series, transmission and reception of a plurality of signals of different frequency bands are able to be performed at the same time, and the steepness of an attenuation slope located within a transition band in bandpass characteristics is increased.

Compared to the case where no low pass filter (LPF 114) is provided, the attenuation of the second HPF 113 in a band corresponding to the pass band of the LPF 114 may be about 15 dB or more, the second HPF 113 may include an inductor and a capacitor, and the LPF 114 may include an inductor and a capacitor. With this configuration, distortion characteristics is improved. A reason considered for the above will be described below.

Elastic wave resonators have relatively poor distortion characteristics. When a high frequency signal with a high signal intensity such as a transmission signal is applied, distortion such as harmonics (second, third, etc.) or intermodulation distortion (IMD2 or IMD3) occurs. Occurrence of distortion leads to degradation of the reception sensitivity of a communication apparatus or the like. Therefore, avoiding occurrence of distortion as much as possible is important in terms of communication quality.

For example, in the case where a transmission signal of a low band (LB), which is the pass band of the LPF 114, is input through the Port 17 in FIG. 12, the transmission signal of the LB is output to the Port 21, and at the same time, a portion of the signal sneaks into the second demultiplexing circuit 120 while being attenuated by the second HPF 113, and distortion is thus generated in an elastic wave resonator included in the second demultiplexing circuit 120.

If the attenuation of the second HPF 113 in the band corresponding to the pass band of the LPF 114 is about 15 dB or more, a transmission signal of the LB reaching the second demultiplexing circuit 120 is suppressed effectively. Accordingly, distortion occurring in the second demultiplexing circuit 120 is effectively reduced or prevented.

In particular, in the case where the pass band of the LB is from about 452 MHz to about 960 MHz and the pass band of the second demultiplexing circuit 120 is from about 1427 MHz to about 2690 MHz, second waves or third waves of the LB partially overlap with the pass band of the second demultiplexing circuit 120. In such a case, this leads to degradation of communication sensitivity. Therefore, in this frequency configuration, it is very effective to ensure the attenuation of the second HPF 113 in the band corresponding to the pass band of the LPF 114 to be about 15 dB or more so that a signal of the LB is avoided from reaching the second demultiplexing circuit 120 as much as possible.

Furthermore, it is desirable that each of the second HPF 113 and the LPF 114 includes an inductor and a capacitor. This is because inductors and capacitors are elements with excellent distortion characteristics.

Figure 13:
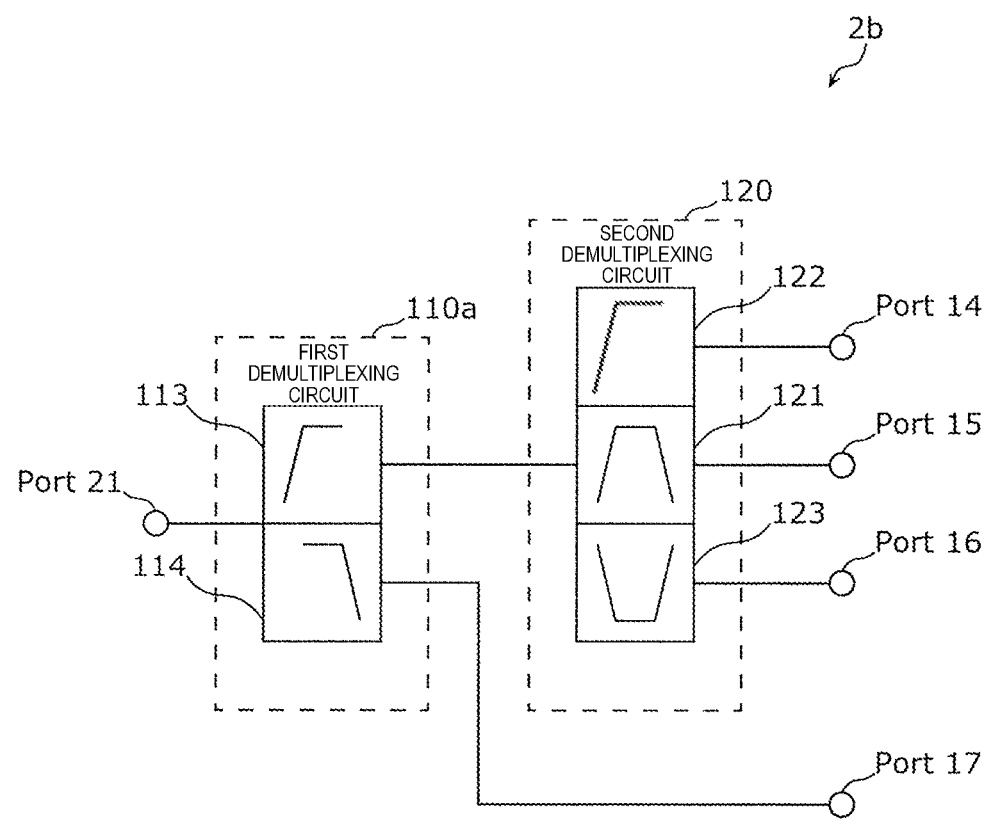
FIG. 13 is a configuration diagram illustrating an example of a high frequency circuit according to another preferred embodiment of the present invention.

FIG. 13 is a configuration diagram illustrating an example of the high frequency circuit 2b according to another preferred embodiment of the present invention.

In the high frequency circuit 2b illustrated in FIG. 13, the second demultiplexing circuit 120 further includes, in addition to the BEF 123 and the BPF 121, a third high pass filter (third HPF 122).

Furthermore, the pass band of the second HPF 113 is located on a high frequency side relative to the pass band of the LPF 114, and the attenuation band of the BEF 123 and the pass bands of the first BPF 121 and the third HPF 122 are located on a high frequency side relative to the pass band of the LPF 114 and overlap with the pass band of the second HPF 113. Accordingly, bandpass characteristics in individual paths connecting the terminal Port 21 with the terminals Port 14 to Port 17 of the high frequency circuit 2b are equal to bandpass characteristics except for the UHB and the LTE-U illustrated in FIG. 8B.

With this configuration, the high frequency circuit 2b may achieve CA for signals over a wide frequency range from, for example, low frequency signals of the LB to, for example, high frequency signals of the HB 2. Furthermore, the attenuation band of the BEF 123, the pass band (HB 1) of the first BPF 121, and the pass band (HB 2) of the third HPF 122 overlap, and therefore, the pass band of the first BPF 121 and the pass band of the third HPF 122 do not overlap with a band (MB) other than the attenuation band of the BEF 123 in the pass band of the second HPF 113. Accordingly, signals containing a frequency component of the pass band of the first BPF 121 or the third HPF 122 and a signal containing a frequency component of a band (MB) other than the attenuation band of the BEF 123 in the pass band of the second HPF 113 are less likely to affect each other. Furthermore, a portion of the pass band of the second HPF 113 is attenuated by an attenuation slope of the BEF 123 with a high steepness, and therefore, the steepness of the attenuation slopes of the second HPF 113 and the BEF 123 which are connected in series is increased. Accordingly, a high frequency signal of the MB and a high frequency signal of the HB 1 are less likely to affect each other. Furthermore, the steepness of the attenuation slopes of the first BPF 121 and the third HPF 122 is high, and therefore, a high frequency signal of the HB 1 and a high frequency signal of the HB 2 are less likely to affect each other.

As described above, with a simple configuration in which the first demultiplexing circuit 110a which includes the second HPF 113 and the LPF 114 and the second demultiplexing circuit 120 which includes the first BPF 121, the third HPF 122, and the BEF 123 are connected in series, transmission and reception of a plurality of signals of different frequency bands are able to be performed at the same time, and the steepness of an attenuation slope located within a transition band in bandpass characteristics is increased.

Figure 14:
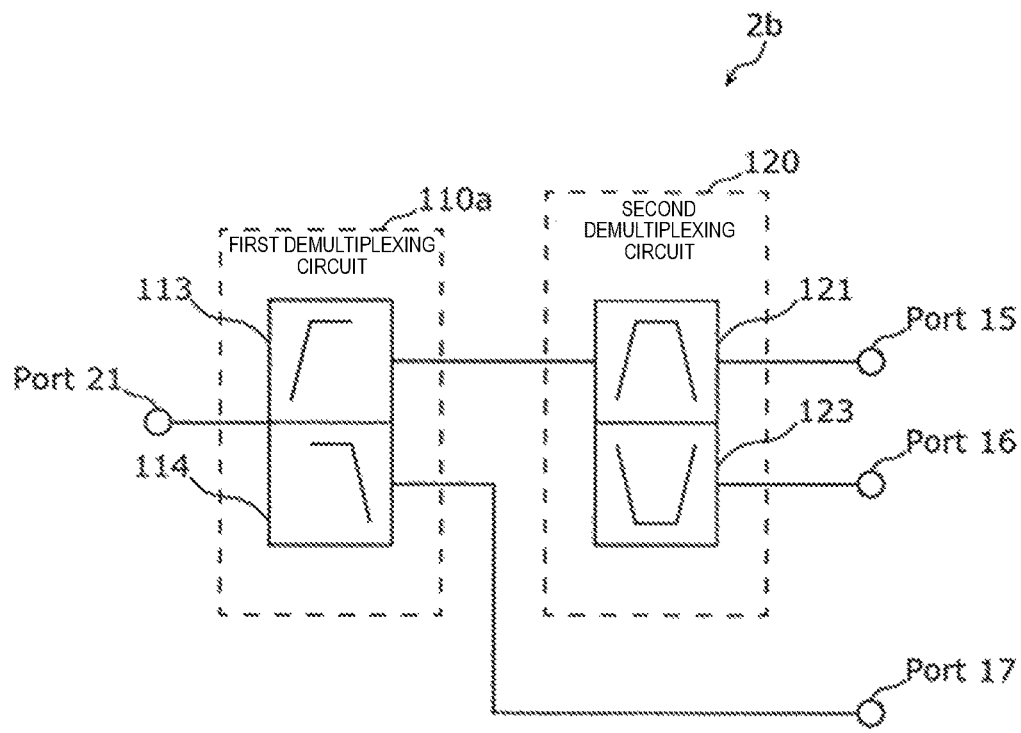
FIG. 14 is a configuration diagram illustrating an example of a high frequency circuit according to another preferred embodiment of the present invention.

FIG. 14 is a configuration diagram illustrating an example of the high frequency circuit 2b in which the second demultiplexing circuit 120 does not include the second BPF 122 but includes the first BPF 121. In the high frequency circuit 2b in FIG. 14, one signal path is divided into three signal paths. That is, the high frequency circuit 2b in FIG. 14 is a triplexer which divides one signal path into three signal paths. For example, in the high frequency circuit 2b in FIG. 14, a high frequency signal (high frequency signal of the HB) of a frequency band from about 2300 MHz to about 2690 MHz is transmitted through a signal path passing through the terminal Port 15. For example, a high frequency signal (high frequency signal of the MB) of a frequency band from about 1427 MHz to about 2200 MHz is transmitted through a signal path passing through the terminal Port 16. For example, a high frequency signal (high frequency signal of the LB) of a frequency band from about 452 MHz to about 960 MHz is transmitted through a signal path passing through the terminal Port 17. With this configuration, carrier aggregation which implements transmission, reception, or both transmission and reception of three signals having pass bands of different frequency bands at the same time is achieved.

Also with a third high pass filter (third HPF 122), instead of the first BPF 121, similar operation and effects are achieved.

Figure 15:
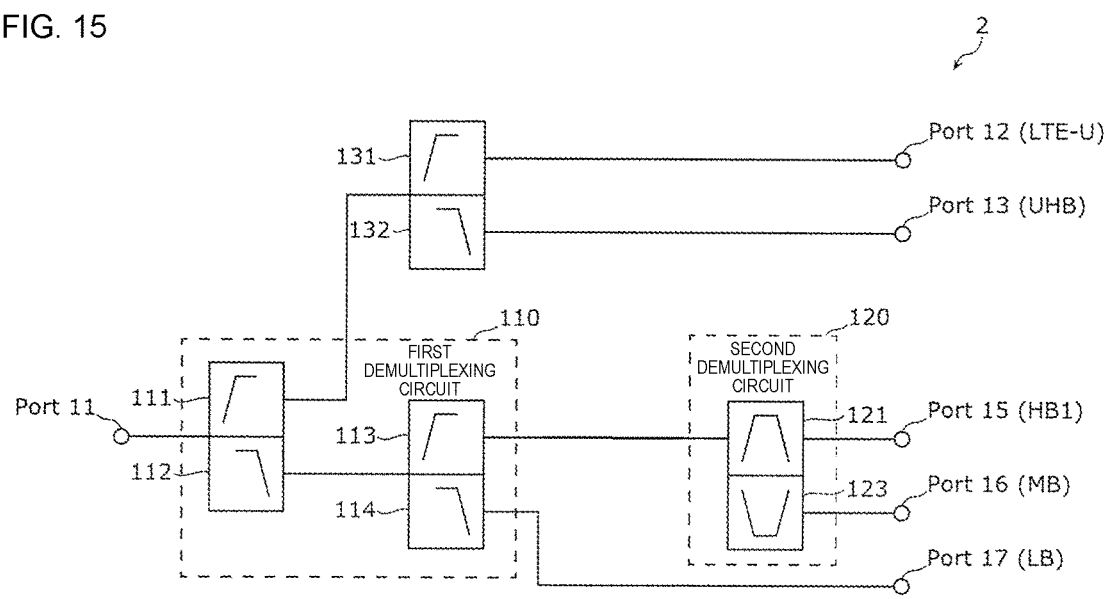
FIG. 15 is a configuration diagram illustrating an example of a high frequency circuit according to another preferred embodiment of the present invention.

FIG. 15 is a configuration diagram illustrating an example of the high frequency circuit 2 in which the second demultiplexing circuit 120 does not include the second BPF 122 but includes the first BPF 121 and a matching circuit is not provided between the first demultiplexing circuit 110 and the second demultiplexing circuit 120.

As illustrated in FIG. 15, the high frequency circuit 2 includes the first demultiplexing circuit 110 and the second demultiplexing circuit 120 which is connected in series with the first demultiplexing circuit 110. The high frequency circuit 2 also includes the HPF 131 (third high pass filter) and the LPF 132 (third low pass filter).

The first demultiplexing circuit 110 includes the first HPF 111, the LPF 112 (first low pass filter), the second HPF 113, and the LPF 114 (low pass filter). The second demultiplexing circuit 120 includes the BEF 123 and the BPF. In this preferred embodiment, the BPF includes the first BPF 121 and the second BPF 122 which have different pass bands. At least one of the BEF 123, the first BPF 121, and the second BPF 122 includes an elastic wave resonator. In this preferred embodiment, for example, each of the BEF 123, the first BPF 121, and the second BPF 122 includes a SAW resonator. The circuit configuration of the BEF 123 is the same as, for example, the circuit configuration illustrated in FIG. 2A, and the circuit configuration of each of the first BPF 121 and the second BPF 122 is the same as, for example, the circuit configuration illustrated in FIG. 2B. Therefore, explanation for the circuit configuration of each of the BEF 123, the first BPF 121, and the second BPF 122 will be omitted.

The high frequency circuit 2 includes the terminals Port 11 to Port 13 and Port 15 to Port 17. For example, an antenna element is connected to the terminal Port 11. Furthermore, high frequency signals of different frequency bands are transmitted through signal paths passing through the terminals Port 12, Port 13, and Port 15 to Port 17. In this preferred embodiment, the high frequency circuit 2 is applied to a reception path and has a function of demultiplexing a high frequency signal input to the terminal Port 11 and outputting the resultant signals from the terminals Port 12, Port 13, and Port 15 to Port 17. The high frequency circuit 2 may be applied to a transmission path and may have a function of multiplexing high frequency signals input to the terminals Port 12, Port 13, and Port 15 to Port 17 and outputting the resultant signal from the terminal Port 11.

In the high frequency circuit 2 in FIG. 15, one signal path is divided into five signal paths. That is, the high frequency circuit 2 in FIG. 15 is a pentaplexer which divides one signal path into five signal paths.

For example, a high frequency signal of the LTE-U is transmitted through a signal path which passes through the terminal Port 12. For example, a high frequency signal of the ultra high band (UHB) is transmitted through a signal path which passes through the terminal Port 13. For example, a high frequency signal of the HB is transmitted through a signal path which passes through the terminal Port 15. For example, a high frequency signal of the MB is transmitted through a signal path which passes through the terminal Port 16. For example, a high frequency signal of the LB is transmitted through a signal path which passes through the terminal Port 17. For example, the LTE-U represents a frequency band of about 5 GHz, the UHB represents a frequency band from about 3400 MHz to about 3800 MHz, the HB represents a frequency band from about 2300 MHz to about 2690 MHz, the MB represents a frequency band from about 1427 MHz to about 2200 MHz, and the LB represents a frequency band from about 452 MHz to about 960 MHz. The above frequency bands are merely examples, and preferred embodiments of the present invention may also be applied to other frequency bands. The high frequency circuit 2 is, for example, a circuit which causes a signal path which is connected to the terminal Port 11 to branch off to the terminals Port 12, Port 13, and Port 15 to Port 17.

With this configuration, carrier aggregation which implements transmission, reception, or both transmission and reception of five signals having pass bands of different frequency bands at the same time are achieved.

Figure 16:
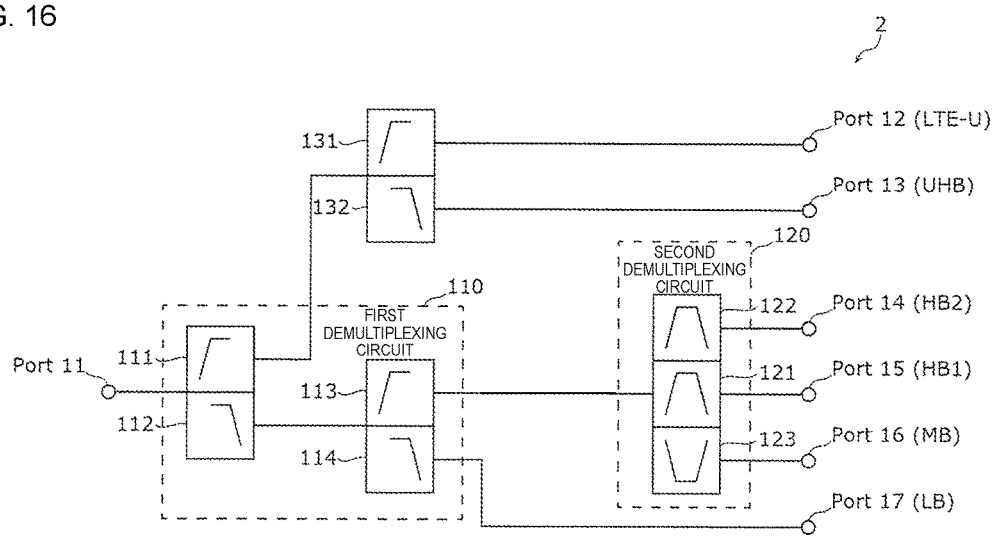
FIG. 16 is a configuration diagram illustrating an example of a high frequency circuit according to another preferred embodiment of the present invention.

FIG. 16 is a configuration diagram illustrating an example of the high frequency circuit 2 which does not include a matching circuit between the first demultiplexing circuit 110 and the second demultiplexing circuit 120.

The high frequency circuit 2 includes the terminals Port 11 to Port 17. For example, an antenna element is connected to the terminal Port 11. Furthermore, high frequency signals of different frequency bands are transmitted through signal paths passing through the terminals Port 12 to Port 17. In this preferred embodiment, the high frequency circuit 2 is applied to a reception path and has a function of demultiplexing a high frequency signal input to the terminal Port 11 and outputting the resultant signals from the terminals Port 12 to Port 17. The high frequency circuit 2 may be applied to a transmission path and may have a function of multiplexing high frequency signals input to the terminals Port 12 to Port 17 and outputting the resultant signal from the terminal Port 11.

In the high frequency circuit 2 in FIG. 16, one signal path is divided into six signal paths. That is, the high frequency circuit 2 in FIG. 16 is a hexaplexer which divides one signal path into six signal paths.

For example, a high frequency signal of the LTE-U is transmitted through a signal path which passes through the terminal Port 12. For example, a high frequency signal of the UHB is transmitted through a signal path which passes through the terminal Port 13. For example, a high frequency signal of the HB 2 is transmitted through a signal path which passes through the terminal Port 14. For example, a high frequency signal of the HB 1 is transmitted through a signal path which passes through the terminal Port 15. For example, a high frequency signal of the MB is transmitted through a signal path which passes through the terminal Port 16. For example, a high frequency signal of the LB is transmitted through a signal path which passes through the terminal Port 17.

For example, the LTE-U represents a frequency band of about 5 GHz, the UHB represents a frequency band from about 3400 MHz to about 3800 MHz, the HB 2 represents a frequency band from about 2496 MHz to about 2690 MHz, the HB 1 represents a frequency band from about 2300 MHz to about 2400 MHz, the MB represents a frequency band from about 1427 MHz to about 2200 MHz, and the LB represents a frequency band from about 452 MHz to about 960 MHz. The above frequency bands are merely examples, and preferred embodiments of the present invention may also be applied to other frequency bands. The high frequency circuit 2 is, for example, a circuit which causes a signal path which is connected to the terminal Port 11 to branch off to the terminals Port 12 to Port 17.

With this configuration, carrier aggregation which implements transmission, reception, or both transmission and reception of six signals having pass bands of different frequency bands at the same time is achieved.

Figure 17:
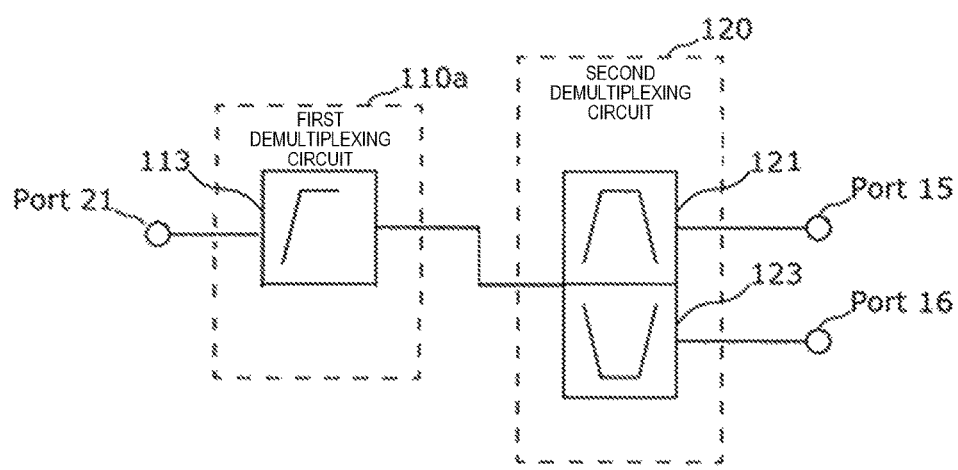
FIG. 17 is a configuration diagram illustrating an example of a high frequency circuit according to another preferred embodiment of the present invention.

FIG. 17 is a configuration diagram illustrating an example of the high frequency circuit 2b according to another preferred embodiment of the present invention.

As illustrated in FIG. 17, the high frequency circuit 2b includes the first demultiplexing circuit 110a that includes the second HPF 113. The high frequency circuit 2b also includes a second demultiplexing circuit that is connected in series with the first demultiplexing circuit 110a and includes the BEF 123 and the BPF 121. At least one of the BEF 123, the first BPF 121, and the second BPF 122 includes an elastic wave resonator.

In the high frequency circuit 2b in FIG. 17, one signal path is divided into two signal paths. That is, the high frequency circuit 2b in FIG. 17 is a diplexer which divides one signal path into two signal paths.

For example, a high frequency signal of the HB is transmitted through a signal path which passes through the terminal Port 15. For example, a high frequency signal of the MB is transmitted through a signal path which passes through the terminal Port 16. For example, the HB represents a frequency band from about 2300 MHz to about 2690 MHz, and the MB represents a frequency band from about 1427 MHz to about 2200 MHz. With this configuration, carrier aggregation which implements transmission, reception, or both transmission and reception of two signals having pass bands of different frequency bands at the same time is achieved.

The attenuation of the second HPF 113 in a region outside a band is about 15 dB or more. Frequencies outside the band are equal to, for example, a frequency band of the LB, which represents high frequency signals from about 452 MHz to about 960 MHz. With this configuration, a high frequency signal of the LB entering through the Port 21 is attenuated sufficiently before reaching the second demultiplexing circuit, and distortion characteristics thus is improved.

For example, the high frequency circuit 2b in FIG. 17 is optimal for use not including the LB. For example, the high frequency circuit 2b in FIG. 17 is optimally used for a 4×4 multiple-input and multiple-output (so-called "4×4 MIMO": technology for transmission and reception of data using four antennas at the same time for each of transmission and reception) which uses a high frequency signal of the HB and a high frequency signal of the MB.

Figure 18:
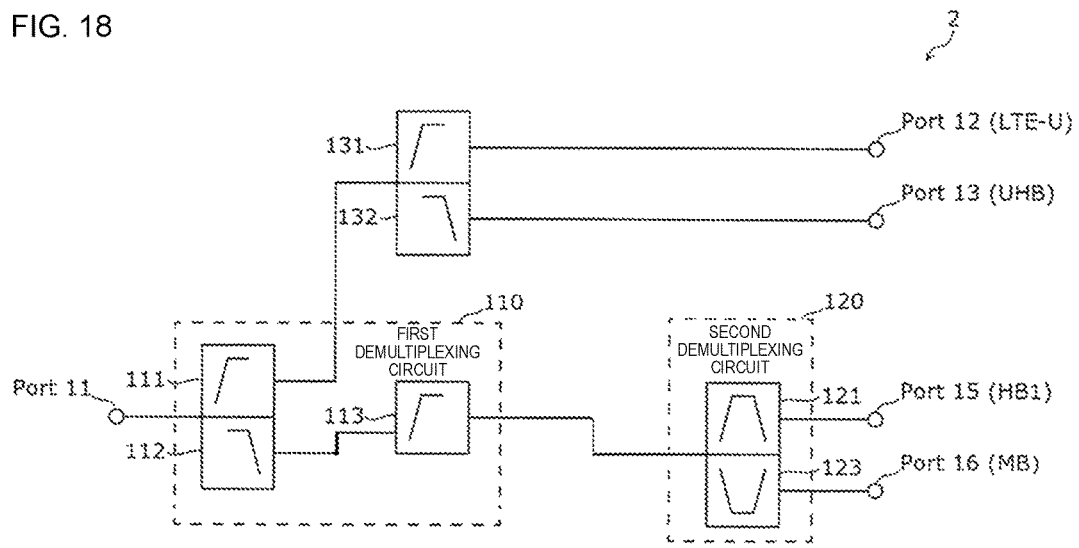
FIG. 18 is a configuration diagram illustrating an example of a high frequency circuit according to another preferred embodiment of the present invention.
Figure 19:
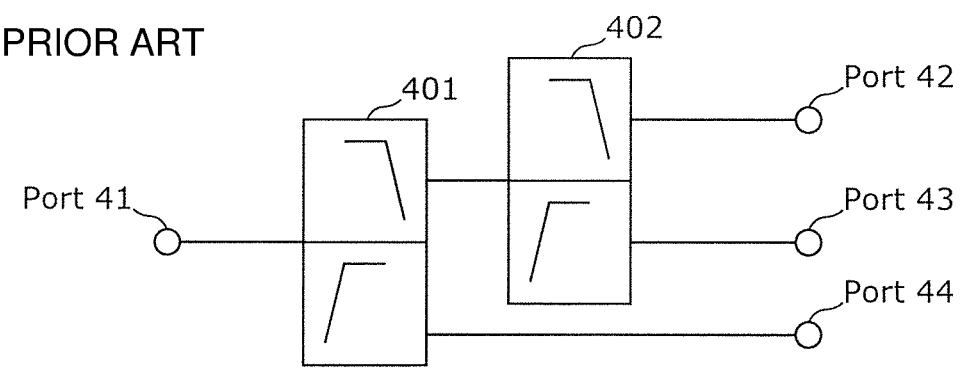
FIG. 19 is a configuration diagram illustrating another example of a known demultiplexing circuit.

FIG. 18 is a configuration diagram illustrating an example of the high frequency circuit 2 according to another preferred embodiment of the present invention.

As illustrated in FIG. 18, the high frequency circuit 2 includes the first demultiplexing circuit 110 and the second demultiplexing circuit 120 which is connected in series with the first demultiplexing circuit 110. The high frequency circuit 2 also includes the HPF 131 (third high pass filter) and the LPF 132 (third low pass filter). The high frequency circuit 2 includes the terminals Port 12, Port 13, Port 15, and Port 16.

The first demultiplexing circuit 110 includes the first HPF 111, the LPF 112 (first low pass filter), and the second HPF 113. The second demultiplexing circuit 120 includes the BEF 123 and the BPF 122. The BEF 123 and the BPF 122 each include an elastic wave resonator. In this preferred embodiment, for example, each of the BEF 123 and the BPF 122 includes a SAW resonator. The circuit configuration of the BEF 123 is the same as, for example, the circuit configuration illustrated in FIG. 2A, and the circuit configuration of the BPF 122 is the same as, for example, the circuit configuration illustrated in FIG. 2B. Therefore, explanation for the circuit configuration of each of the BEF 123 and the BPF 122 will be omitted.

For example, an antenna element is connected to the terminal Port 11. Furthermore, high frequency signals of different frequency bands are transmitted through signal paths passing through the terminals Port 12, Port 13, Port 15, and Port 16. In this preferred embodiment, the high frequency circuit 2 is applied to a reception path and has a function of demultiplexing a high frequency signal input to the terminal Port 11 and outputting the resultant signals from the terminals Port 12, Port 13, Port 15, and Port 16. The high frequency circuit 2 may be applied to a transmission path and may have a function of multiplexing high frequency signals input to the terminals Port 12, Port 13, Port 15, and Port 16 and outputting the resultant signal from the terminal Port 11. The first demultiplexing circuit 110a includes the second HPF 113. The second multiplexing circuit includes the BEF 123 and the BPF 121. At least one of the BEF 123, the first BPF 121, and the second BPF 122 includes an elastic wave resonator.

In the high frequency circuit 2 in FIG. 18, one signal path is divided into four signal paths. That is, the high frequency circuit 2 in FIG. 18 is a quadplexer which divides one signal path into four signal paths.

For example, a high frequency signal of the LTE-U is transmitted through a signal path which passes through the terminal Port 12. For example, a high frequency signal of the UHB is transmitted through a signal path which passes through the terminal Port 13. For example, a high frequency signal of the HB is transmitted through a signal path which passes through the terminal Port 15. For example, a high frequency signal of the MB is transmitted through a signal path which passes through the terminal Port 16. For example, the LTE-U represents a frequency band of about 5 GHz, the UHB represents a frequency band from about 3400 MHz to about 3800 MHz, the HB represents a frequency band from about 2300 MHz to about 2690 MHz, and the MB represents a frequency band from about 1427 MHz to about 2200 MHz. The above frequency bands are merely examples, and preferred embodiments of the present invention may also be applied to other frequency bands. The high frequency circuit 2 is, for example, a circuit which causes a signal path which is connected to the terminal Port 11 to branch off to the terminals Port 12, Port 13, Port 15, and Port 16. With this configuration, carrier aggregation which implements transmission, reception, or both transmission and reception of four signals having pass bands of different frequency bands at the same time is achieved.

The attenuation of the second HPF 113 in the pass band of the LPF 114 is about 15 dB or more. With this configuration, distortion characteristics are improved.

For example, the high frequency circuit 2 in FIG. 18 is optimally used for a 4×4 multiple-input and multiple-output (so-called "4×4 MIMO": technology for transmission and reception of data using four antennas at the same time for each of transmission and reception) which uses a high frequency signal of the LTE-U, a high frequency signal of the UHB, a high frequency signal of the HB, and a high frequency signal of the MB.

Furthermore, for example, in the foregoing preferred embodiments, a BEF included in a first demultiplexing circuit has the circuit configuration illustrated in FIG. 2A. However, the present invention is not limited to this. The BEF may be implemented with another circuit configuration which includes an elastic wave resonator. Furthermore, in the foregoing preferred embodiments, a BPF included in a second demultiplexing circuit has the circuit configuration illustrated in FIG. 2B. However, the present invention is not limited to this. The BPF may be implemented with another circuit configuration which includes an elastic wave resonator.

Furthermore, for example, in the first preferred embodiment, three signal paths are combined into one signal path (That is, a triplexer). However, the present invention is not limited to this. Four or more signal paths may be combined into one signal path (that is, a quadplexer, a pentaplexer, a hexaplexer, or other multiplexers.).

Furthermore, for example, in the second preferred embodiment, one signal path is divided into six signal paths. However, the present invention is not limited to this. For example, in the case where the high frequency circuit 2 includes neither the HPF 131 nor the LPF 132 or in the case where the second demultiplexing circuit 120 includes a single BPF, one signal path may be divided into five signal paths. Furthermore, for example, in the case where the high frequency circuit 2 includes neither the HPF 131 nor the LPF 132 and the second demultiplexing circuit 120 includes a single BPF, one signal path may be divided into four signal paths.

Furthermore, in the modification of the first preferred embodiment, the communication apparatus 100 includes the high frequency circuit 1a. However, the present invention is not limited to this. For example, the communication apparatus 100 may include the high frequency circuit 1. That is, the communication apparatus 100 may not include the LNA circuit 30, the switch circuit 40, the third demultiplexing circuit 50, or the like.

Furthermore, in the modification of the second preferred embodiment, the communication apparatus 200 includes the high frequency circuit 2a. However, the present invention is not limited to this. For example, the communication apparatus 200 may include the high frequency circuit 2. That is, the communication apparatus 200 may not include the LNA circuit 160, the switch circuit 170, the third demultiplexing circuit 180, or the like.

In addition to the above, preferred embodiments obtained by making various modifications to preferred embodiments by those skilled in the art and preferred embodiments implemented by combining components and functions in preferred embodiments in a desired manner without departing from the scope of the present invention are also included in the present invention.

Preferred embodiments of the present invention may be widely used, as a high frequency circuit and a communication apparatus having a simple configuration, capable of performing transmission and reception of a plurality of signals of different frequency bands at the same time, and having an increased steepness of an attenuation slope located within a transition band in bandpass characteristics, for communication equipment such as cellular phones.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency circuit comprising:
   a first demultiplexing circuit which includes a first high pass filter and a low pass filter; and
   a second demultiplexing circuit which includes a band elimination filter and a band pass filter, at least one of the band elimination filter and the band pass filter of the second demultiplexing circuit being connected in series with at least one of the first high pass filter and the low pass filter of the first demultiplexing circuit; wherein
   at least one of the band elimination filter and the band pass filter includes an elastic wave resonator;
   a pass band of the first high pass filter is located on a higher frequency side of a pass band of the low pass filter; and
   an attenuation band of the band elimination filter and a pass band of the band pass filter are located between the pass band of the first high pass filter and the pass band of the low pass filter.

2. The high frequency circuit according to claim 1, wherein
   the first high pass filter and the low pass filter include a first common terminal that is an input or output terminal of the first high pass filter and the low pass filter;
   the first common terminal and an input or output terminal of the band elimination filter are connected in series;
   the band elimination filter and the band pass filter include a second common terminal that is an input or output terminal of the band elimination filter and the band pass filter; and
   an attenuation slope located within a transition band in bandpass characteristics of the band elimination filter causes at least one of an attenuation slope located within a transition band in bandpass characteristics of the first high pass filter and an attenuation slope located within a transition band in bandpass characteristics of the low pass filter to be attenuated.

3. The high frequency circuit according to claim 1, wherein
   the first demultiplexing circuit further includes a second high pass filter;
   the band elimination filter and the band pass filter include a common terminal that is an input or output terminal of the band elimination filter and the band pass filter;
   the common terminal and an input or output terminal of the second high pass filter are connected;
   a pass band of the second high pass filter is located between the pass band of the first high pass filter and the pass band of the low pass filter; and
   the pass band of the second high pass filter, the pass band of the band pass filter, and the attenuation band of the band elimination filter overlap.

4. The high frequency circuit according to claim 1, wherein the first high pass filter and the low pass filter are LC resonance circuits.

5. The high frequency circuit according to claim 1, wherein an inductor is connected in parallel with the band pass filter.

6. The high frequency circuit according to claim 1, wherein the band pass filter includes a first band pass filter and a second band pass filter having different pass bands.

7. The high frequency circuit according to claim 6, further comprising:
   a matching circuit which is connected to the first band pass filter and the second band pass filter; wherein
   the first demultiplexing circuit further includes a second high pass filter;
   the pass band of the first band pass filter and the pass band of the second band pass filter are located in a pass band of the second high pass filter, the pass band of the first band pass filter is closer to a pass band of the band elimination filter than the pass band of the second band pass filter is, the pass band of the band elimination filter being a frequency range except the attenuation band of the band elimination filter that is located in the pass band of the second high pass filter and lower than the pass band of the first band pass filter; and
   wiring which connects the matching circuit with the first band pass filter is shorter than wiring which connects the matching circuit with the second band pass filter.

8. The high frequency circuit according to claim 1, further comprising:
   a low noise amplifier circuit; wherein
   the first demultiplexing circuit and the low noise amplifier circuit are defined by a same chip.

9. The high frequency circuit according to claim 1, further comprising:
   a switch circuit; wherein
   the first demultiplexing circuit and the switch circuit are defined by a same chip.

10. The high frequency circuit according to claim 1, further comprising:
    a multilayer substrate which includes a plurality of laminated layers; wherein
    each of the first high pass filter and the low pass filter includes an LC resonance circuit;
    each of the band elimination filter and the band pass filter is a ladder surface acoustic wave filter;
    the multilayer substrate includes a reference ground layer that is a lowermost layer of the multilayer substrate, a first layer, and a second layer;
    a reference ground pattern having a reference potential of the multilayer substrate is provided at the reference ground layer;
    a ground pattern of the first demultiplexing circuit is provided at the first layer, the ground pattern of the first demultiplexing circuit being electrically connected to the reference ground pattern;
    a ground pattern of the second demultiplexing circuit is provided at the second layer, the ground pattern of the second demultiplexing circuit being electrically connected to the reference ground pattern; and
    the first layer is closer to the reference ground layer than the second layer is.

11. The high frequency circuit according to claim 1, further comprising:

a multilayer substrate including a plurality of laminated layers; and a third demultiplexing circuit which is an elastic wave filter; wherein a ground pattern of the second demultiplexing circuit and a ground pattern of the third demultiplexing circuit are isolated from each other at one of the plurality of layers.

12. A communication apparatus comprising:

a signal processing circuit which processes a high frequency signal transmitted and received through an antenna element; and the high frequency circuit according to claim 1 which transmits the high frequency signal between the antenna element and the signal processing circuit.

13. A high frequency circuit comprising:

a first demultiplexing circuit which includes a first high pass filter and a low pass filter; and a second demultiplexing circuit which includes a band elimination filter and a band pass filter, at least one of the band elimination filter and the band pass filter of the second demultiplexing circuit being connected in series with at least one of the first high pass filter and the low pass filter of the first demultiplexing circuit; wherein at least one of the band elimination filter and the band pass filter includes an elastic wave resonator;

a pass band of the first high pass filter is located on a higher frequency side of a pass band of the low pass filter;

an attenuation band of the band elimination filter and a pass band of the band pass filter are located on a higher frequency side of the pass band of the low pass filter and overlap with the pass band of the first high pass filter; and a pass band of the band elimination filter, being a frequency range except the attenuation band of the band elimination filter in the pass band of the first high pass filter, is lower than the pass band of the band pass filter.

14. The high frequency circuit according to claim 13, wherein the band elimination filter is a hybrid filter which includes at least one elastic wave resonator and at least one inductor.

15. The high frequency circuit according to claim 13, wherein the first and second demultiplexing circuits each function as both a demultiplexing circuit and a multiplexer; and the high frequency circuit is a multiplexer which performs transmission, reception, or both transmission and reception of a plurality of signals at the same time with a configuration in which the first demultiplexing circuit including the first high pass filter and the low pass filter and the second demultiplexing circuit including the band pass filter and the band elimination filter are connected in series.

16. The high frequency circuit according to claim 13, wherein the attenuation of the first high pass filter in the pass band of the low pass filter is about 15 dB or more, compared to a case where the low pass filter is not provided;

the first high pass filter includes an inductor and a capacitor; and the low pass filter includes an inductor and a capacitor.

17. The high frequency circuit according to claim 13, wherein a portion of the pass band of the band pass filter overlaps with a portion of the attenuation band of the band elimination filter.

18. The high frequency circuit according to claim 13, wherein the second demultiplexing circuit further includes a high pass filter.

19. The high frequency circuit according to claim 18, wherein the second multiplexing circuit further includes a band pass filter; and the high frequency circuit is a quadplexer.

20. The high frequency circuit according to claim 13, wherein the band elimination filter includes a low pass filter circuit and a high pass filter circuit which is connected in series with the low pass filter circuit.

21. The high frequency circuit according to claim 13, wherein an inductor is connected in parallel with the band pass filter.

22. The high frequency circuit according to claim 13, further comprising a matching circuit which is connected between the first high pass filter and the second demultiplexing circuit.

23. The high frequency circuit according to claim 22, wherein the matching circuit includes at least one of an inductor and a capacitor.

24. The high frequency circuit according to claim 22, wherein the band pass filter includes a first band pass filter and a second band pass filter having different pass bands;

the first demultiplexing circuit further includes a second high pass filter;

the pass band of the first band pass filter and the pass band of the second band pass filter are located in a pass band of the second high pass filter, the pass band of the first band pass filter is located closer to the pass band of the band elimination filter than the pass band of the second band pass filter is, the pass band of the band elimination filter is located in the pass band of the second high pass filter and is lower than the pass band of the first band pass filter; and wiring which connects the matching circuit with the first band pass filter is shorter than wiring which connects the matching circuit with the second band pass filter.

25. The high frequency circuit according to claim 13, wherein the high frequency circuit is a triplexer.

26. The high frequency circuit according to claim 13, further comprising:

a third high pass filter; and a third low pass filter; wherein the first demultiplexing circuit further includes a second high pass filter and a second low pass filter;

the first high pass filter and the low pass filter are connected to the second low pass filter;

the third high pass filter and the third low pass filter are connected to the second high pass filter; and the high frequency circuit is a pentaplexer.

27. The high frequency circuit according to claim 26, wherein the second demultiplexing circuit further includes a band pass filter or a high pass filter; and the high frequency circuit is a hexaplexer.

28. A high frequency circuit comprising:

a first demultiplexing circuit which includes a first high pass filter; and a second demultiplexing circuit which includes a band elimination filter and a band pass filter, at least one of the band elimination filter and the band pass filter of the second demultiplexing circuit being connected in series with the first high pass filter of the first demultiplexing circuit; wherein the first and second demultiplexing circuits each function as both a demultiplexing circuit and a multiplexer;

at least one of the band elimination filter and the band pass filter includes an elastic wave resonator;

an attenuation band of the band elimination filter and a pass band of the band pass filter overlap with a pass band of the first high pass filter;

the band elimination filter is a hybrid filter which includes at least one elastic wave resonator and at least one inductor;

the high frequency circuit is a multiplexer which performs transmission, reception, or both transmission and reception of a plurality of signals at the same time with a configuration in which the first demultiplexing circuit including the first high pass filter and the low pass filter and the second demultiplexing circuit including the band pass filter and the band elimination filter are connected in series; and an attenuation slope located within a transition band in bandpass characteristics of the band elimination filter causes an attenuation slope located within a transition band in bandpass characteristics of the first high pass filter to be attenuated.

29. The high frequency circuit according to claim 28, further comprising:

a third high pass filter; and a third low pass filter; wherein the first demultiplexing circuit further includes a second high pass filter and a second low pass filter;

the first high pass filter is connected to the second low pass filter; and the third high pass filter and the third low pass filter are connected to the second high pass filter.

* * * * *